United States Patent
Diao et al.

(10) Patent No.: US 8,976,901 B2
(45) Date of Patent: Mar. 10, 2015

(54) PHASE SHIFT KEYING TRANSMITTER CIRCUIT

(75) Inventors: Shengxi Diao, Singapore (SG); Yuan Gao, Singapore (SG); Yuanjin Zheng, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 166 days.

(21) Appl. No.: 13/699,825

(22) PCT Filed: May 25, 2011

(86) PCT No.: PCT/SG2011/000191
§ 371 (c)(1),
(2), (4) Date: Mar. 8, 2013

(87) PCT Pub. No.: WO2011/149425
PCT Pub. Date: Dec. 1, 2011

(65) Prior Publication Data
US 2013/0163689 A1    Jun. 27, 2013

(30) Foreign Application Priority Data
May 26, 2010 (SG) ................. 201003698-6

(51) Int. Cl.
*H04L 27/20* (2006.01)
*H03C 3/00* (2006.01)
(Continued)

(52) U.S. Cl.
CPC *H04L 27/20* (2013.01); *H03C 3/00* (2013.01); *H04L 27/2046* (2013.01); *H03B 5/1228* (2013.01); *H03B 5/1215* (2013.01); *H03B 5/124* (2013.01); *H04B 13/005* (2013.01)
USPC ............. 375/308; 375/302; 375/295; 455/91; 455/23; 455/7

(58) Field of Classification Search
CPC ............... A61B 5/0028; A61B 5/6861; A61B 1/00016; A61B 1/041; H04B 13/005; H04B 5/0043

USPC .............. 331/117 R, 172, 117 FE, 45, 108 R, 331/107 R; 375/308, 302, 295; 455/323, 455/313, 333, 23, 7
See application file for complete search history.

(56) References Cited

U.S. PATENT DOCUMENTS

| | | |
|---|---|---|
| 3,242,431 A | 3/1966 | Crafts |
| 5,650,996 A | 7/1997 | Bode et al. |

(Continued)

OTHER PUBLICATIONS

Razavi, A Study of Injection Locking and Pulling in Oscillators, 39 IEEE Journal of Solid-State Circuits, 2004, pp. 1421-1424.*

(Continued)

*Primary Examiner* — Chieh M Fan
*Assistant Examiner* — Michelle M Koeth
(74) *Attorney, Agent, or Firm* — K. David Crockett, Esq.; Niky Economy Syrengelas, Esq.; Crockett & Crockett, PC

(57) ABSTRACT

A phase shift keying transmitter circuit that includes: a variable frequency conversion stage adapted to receive a first data signal, wherein the variable frequency conversion stage comprises a plurality of frequency modulating elements, wherein the first data signal controls the number of the plurality of frequency modulating elements that are operated so as to control an operating frequency of the variable frequency conversion stage; and an output stage configured to switch between one of two possible outputs, the signals provided by one of the two possible outputs having an opposite polarity to the other, wherein the output stage is configured to receive a second data signal to control the switching between the two possible outputs, wherein the output stage is coupled to the variable frequency conversion stage and wherein the switching between the two possible outputs changes the phase of a signal from the variable frequency conversion stage by 180°.

18 Claims, 19 Drawing Sheets

(51) Int. Cl.
*H03B 5/12* (2006.01)
*H04B 13/00* (2006.01)

(56) References Cited

U.S. PATENT DOCUMENTS

| | | |
|---|---|---|
| 5,805,567 A | 9/1998 | Ramesh |
| 5,847,622 A | 12/1998 | Chen |
| 6,084,921 A | 7/2000 | Cronin |
| 2007/0218850 A1* | 9/2007 | Pan .......................... 455/189.1 |
| 2010/0277234 A1* | 11/2010 | Luo et al. ...................... 329/307 |

OTHER PUBLICATIONS

Chul Kim; Nooshabadi, S.; Lehmann, T., "An UWB system for wireless endoscope," Biomedical Circuits and Systems Conference, 2008. BioCAS 2008. IEEE , vol., No., pp. 177,180, Nov. 20-22, 2008.*

Jeong-Cheol Lee; Myung-Woon Hwang; Seokyong Hong; Moon-Kyung Ahn; Seongheon Jeong; Yong-Hun Oh; Seungbum Lim; Hyunha Cho; Jecheol Moon; Jong-Ryul Lee; Sangwoo Han; Handa, C.; Fujie, T.; Hashimoto, K.; Tamukai, K., "A 1.2V 57mW mobile ISDB-T SoC in 90nm CMOS," Solid-State Circuits Conference, 2009. A-SSCC 2009. IEEE Asian , vol., No., pp. 345,348, 16.*

Shengxi Diao; Yuanjin Zheng; Chun-Huat Heng, "A CMOS Ultra Low-Power and Highly Efficient UWB-IR Transmitter for WPAN Applications," Circuits and Systems II: Express Briefs, IEEE Transactions on , vol. 56, No. 3, pp. 200,204, Mar. 2009.*

Zarlink Corp., Ultra Low-Power RF Transceiver, Datasheet ZL70250, (2008).

Wong, et al., A 1V Wireless Transceiver for an Ultra-Low-Power SoC for Biotelemetry Applications, 43 IEEE Journal of Solid-State Circuits, 1511 (2008).

Razavi, A Study of Injection Locking and Pulling in Oscillators, 39 IEEE Journal of Solid-State Circuits, 1415 (2004).

Lee, et al., Study of Subharmonically Injection-Locked PLLs, 44 IEEE Journal of Solid-State Circuits, 1539 (2009).

Harjani, et al., Fast Hopping Injection Locked Frequency Generation for UWB, IEEE International Conference on Ultra-Wideband, 502 (2007).

Bohorquez, et al., A 350uW CMOS MSK Transmitter and 400uW OOK Super-Regenerative Receiver for Medical Implant Communications, 44 IEEE Journal of Solid-State Circuits, 1248 (2009).

Xiaoli, et al., New Approach for QPSK Modulation, VTC, 1225 (2001).

Liu, et al., A 200pJ/b MUX-Based RF Transmitter for Implantable Multichannel Neural Recording, 57 IEEE Transactions on Microwave Theory and Techniques, 2553 (2009).

Zeng, et al., Frequency Multiplication and QPSK Modulation with Subharmonic Injection-Locked Active Antenna, Proceedings of the Second Annual Conference on Communication Networks and Services Research (2004).

* cited by examiner

| Data1 | Data0 | Output Phase |
|---|---|---|
| 1 | 1 | 45° |
| 1 | 0 | -45° |
| 0 | 0 | 135° |
| 0 | 1 | -135° |

Figure 5

| | Measurement results |
|---|---|
| Process | CMOS 0.18 μ m |
| Supply Voltage | 1.4V/1.2V |
| Die Area | 0.4mm X 0.7mm (active core) |
| Modulation | QPSK/O-QPSK |
| Maximum Data Rate | 50Mbps |
| (PDC)Power Consumption(mW) | 5.88/3 |
| EVM | 6.6% |
| Injected Signal | 1V 100MHz |
| Output Power (dBm) | -3.3/-15 |
| Center frequency | 900MHz |
| Phase Noise @ 1MHz (dBc/Hz) | -121/-122 |

|  | 1304 | 1306 | 1308 | 1310 | 1200 |
|---|---|---|---|---|---|
| Freq (MHz) | 862-870 902-928 | 863-870 902-928 | 402-405 | 402-405 | *900MHz* |
| Mod. | 2FSK | GFSK | GMSK | O-QPSK | *O-QPSK/ QPSK* |
| Data Rate (bps) | 50K | 186K | 120K | 17.5M | *50M* |
| $P_{TX}$(dBm) | -7 | 0 | - | -8 (1.8V) | *-3.3/-15* |
| Power (mW) | 3.1 | 2.5 | 0.35 | 3.5 (1.2V) | *5.88/3* |
| Core Area (mm2) | 7 (Whole Chip) | 5.93 (Whole Chip) | 0.5 | 0.7 | *0.28* |
| Energy/bit | 0.2nJ/bit | 13.44nJ/bit | 2.92nJ/bit | 0.2nJ/bit | *0.12/0.06nJ/bit* |
| Tech. | 130nm | 180nm | 90nm | 180nm | *180nm* |
| FOM (fJ/(bit·m)) | 239 | 446 | - | 26 | *13.2/26* |

Figure 13B

PHASE SHIFT KEYING TRANSMITTER CIRCUIT

TECHNICAL FIELD

Various embodiments relate to a phase shift keying transmitter circuit.

BACKGROUND

Industrial scientific medical (ISM) frequency bands are used in biomedical applications.

One particular band of interest, which provides a good compromise between in-body loss and antenna efficiency, falls in the 902-928 MHz frequency range and has quite limited bandwidth. For high quality imaging application with typical resolution of 640×480 pixels and frame rate of 10 fps, both bandwidth efficient modulation scheme and high ratio of image compression are needed.

Datasheet ZL70250 from Zarlink Corporation and A. C. W. Wong, G. Kathiresan, C. K. T. Chan, O. Eljamaly, O. Omeni, D. Mcdonagh, A. J. Burdett and C. Toumazou, "A 1V wireless transceiver for an ultra-low-power SoC for biotelemetry applications," *IEEE J. Solid-State Circuits*, vol. 43, No. 7, pp. 1511-1521, July 2008 disclose wireless transmitters employed in biomedical imaging applications that adopt frequency shift keying (FSK) modulation schemes. However, the data rate of these two transmitters is limited to a few Mbps, due to their bandwidth modulation schemes.

Y.-H. Liu, C.-L. Li and T.-H. Lin, "A 200-pJ/b MUX-based RF transmitter for implantable multichannel neural recording," *IEEE T. on Microwave Theory and Techniques*, vol. 57, pp. 2533-2541, October 2009 discloses a transmitter used for neural recording application that employs an orthogonal quadrature phase shift keying (O-QPSK) modulation scheme that can achieve data rate up to 17.5 Mbps. However, the system complexity limits the achievable power consumption level.

There is thus a need to have a transmitter with simple architecture, which enables high data rate transmission and consumes low power.

SUMMARY

In various embodiments, there is provided a phase shift keying transmitter circuit including: a variable frequency conversion stage adapted to receive a first data signal, wherein the variable frequency conversion stage comprises a plurality of frequency modulating elements, wherein the first data signal controls the number of the plurality of frequency modulating elements that are operated so as to control an operating frequency of the variable frequency conversion stage; and an output stage configured to switch between one of two possible outputs, the signals provided by one of the two possible outputs having an opposite polarity to the other, wherein the output stage is configured to receive a second data signal to control the switching between the two possible outputs, wherein the output stage is coupled to the variable frequency conversion stage and wherein the switching between the two possible outputs changes the phase of a signal from the variable frequency conversion stage by 180°.

In the context of various embodiments, the term "phase shift keying transmitter circuit" may refer to circuitry that can convey data by changing, or modulating, the phase of a reference signal (the carrier wave). Analog or digital modulation may be used. The circuit may include a modulator using a finite number of distinct signals to represent digital data. A finite number of phases, each assigned a unique pattern of binary digits, may be used. Each phase may encode an equal number of bits. Each pattern of bits forms the symbol that is represented by the particular phase. The phase shift keying transmitter circuit may further include means for the modulated carrier wave (carrying the encoded data) to be transmitted.

In the context of various embodiments, the term "circuit" may be understood as any kind of a logic implementing entity, which may be special purpose circuitry or a processor executing software stored in a memory, firmware, or any combination thereof. Thus, in an embodiment, a circuit may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A circuit may also be a processor executing software, e.g. any kind of computer program, e.g. a computer program using a virtual machine code such as e.g. Java. Any other kind of implementation of the respective functions which will be described in more detail below may also be understood as a circuit in accordance with an alternative embodiment.

In the context of various embodiments, the term "variable frequency conversion stage" may mean a stage having an operating frequency that is variable and determined by external means, such as by data that the phase transmitter circuit transmits. Changing the operating frequency of the variable frequency conversion stage has the effect of changing the phase of the output signal of the phase shift keying transmitter circuit. Thus, in various embodiments, the variable frequency conversion stage provides a means to control the output phase of the phase shift keying transmitter circuit.

In the context of various embodiments, the term "first data signal" may mean a digital signal of logic levels "1" or "0". In the context of various embodiments, the first data signal acts as a first means of controlling an output phase of signal emitted from the phase shift keying transmitter circuit.

In the context of various embodiments, the term "frequency modulating elements" may mean devices that change the phase of a signal that is applied thereto. In various embodiments, the "frequency modulating elements" includes capacitors or inductors.

In the context of various embodiments, the phrase "the number of the plurality of frequency modulating elements that are operated" may mean the number of frequency modulating elements that are electrically connected at any instance of operation, so that the remaining frequency modulating elements are not connected.

In the context of various embodiments, the term "output stage" may mean the final stage of the phase shift keying transmitter circuit, so that a signal (the output signal) tapped from the output stage would have been processed by the various stages in the phase shift keying transmitter circuit. In this manner, the output signal would be a signal having been encoded by the unique phase pattern of the phase shift keying transmitter circuit.

In the context of various embodiments, the term "switch" may mean a selection of possible outputs that the output stage is configured to emit.

In the context of various embodiments, the term "opposite polarity" may mean between two signals, there is a reversal in the phase of one signal compared to the other, so that there is a phase difference of 180° between the two signals. In various embodiments, the output stage may be used together with the variable frequency conversion stage to control the output phase of the phase shift keying transmitter circuit.

In the context of various embodiments, the term "second data signal" may mean a digital signal of logic levels "1" or "0". The second data signal may be discrete from the first control signal. In the context of various embodiments, the second data signal acts as a second means of controlling an output phase of signal emitted from the phase shift keying transmitter circuit.

In the context of various embodiments, the term "coupled" may mean an electrical connection between a terminal of a first component and a terminal of one or more other components. The electrical connection may be a direct connection, so that the terminals of all the components are connected to a common point; or an indirect connection, so that the terminal of the first component is connected to the terminal of the one or more other components through an interface.

According to one aspect of the invention, there is provided a phase shift keying receiver adapted to receive and extract data from a phase shift keying transmitter according to various embodiments. In the context of various embodiments, the term "phase shift keying receiver" means a demodulator, which is designed specifically for the symbol-set used by the phase shift keying transmitter circuit of various embodiments, to determine the phase of the received signal and map it back to the symbol it represents, thus recovering the original data.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a table that summarises the output phase shift of a carrier signal when subjected to a respective combination of input from control signals.

FIG. 13B shows a table that summarises the comparison of the performance of a chip, according to an embodiment, with other shift key transmitters.

DETAILED DESCRIPTION

Various embodiments provide for a QPSK (quadrature phase shift keying)/O-QPSK (orthogonal quadrature phase shift keying) transmitter, operating at 900 MHz, based on injection-locking technique. The transmitter may achieve desired phase modulation through direct control of self-resonant tank frequency and through the use of a polarity swap circuit. This eliminates the need of PLL (phase lock loop), a mixer and a summer, resulting in better phase noise performance, lower power consumption and smaller die size.

QPSK modulation is bandwidth efficient, but requires complex circuitry compared to other modulation techniques like ASK (amplitude shift keying) and BPSK (binary phase shift keying). Having complex circuitry reduces power efficiency. Advantageously, various embodiments provide a simple circuit to realise the QPSK modulation, and are compatible with conventional transmitters, without the need for an interface. Various embodiments thus fulfill in-body device requirements of low-power, low-complexity and high-bandwidth efficiency. Various embodiments use injection-lock to realise QPSK modulation with simple circuit implementation.

Figure 1A:
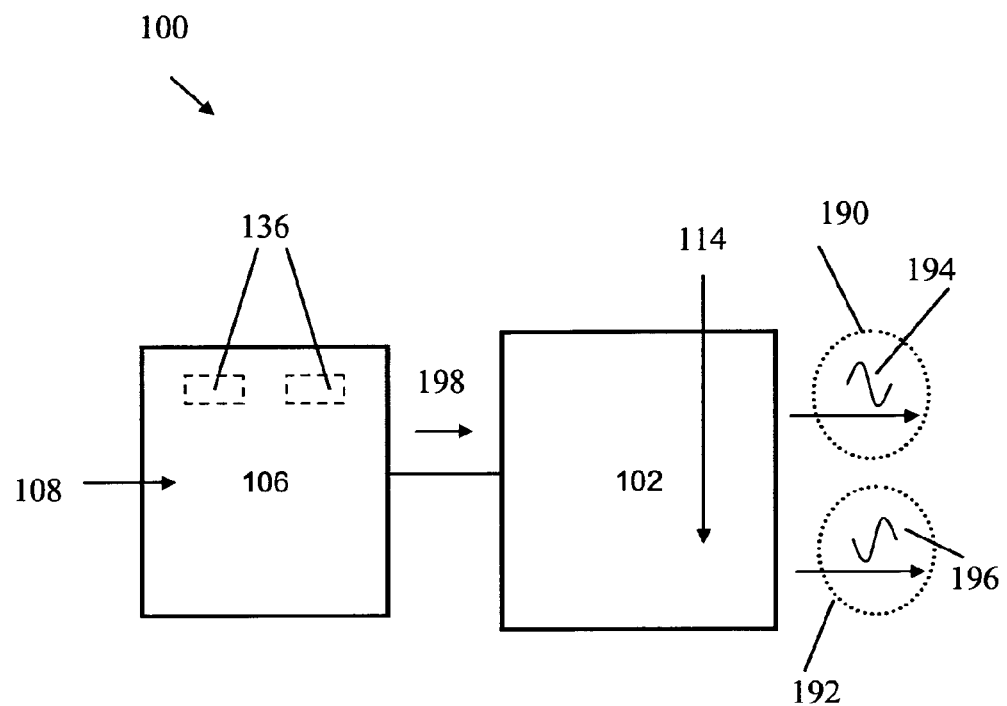
FIG. 1A is a schematic representation of a phase shift keying transmitter circuit according to an embodiment.

FIG. 1A is a schematic representation of a phase shift keying transmitter circuit 100 according to an embodiment.

The phase shift keying transmitter circuit 100 may include: a variable frequency conversion stage 106 adapted to receive a first data signal 108, wherein the variable frequency conversion stage 106 may include a plurality of frequency modulating elements 136. The first data signal 108 controls the number of the plurality of frequency modulating elements 136 that are operated so as to control an operating frequency of the variable frequency conversion stage 106. The phase shift keying transmitter circuit 100 also includes an output stage 102 configured to switch between one of two possible outputs (190, 192), the signals (194, 196) provided by one of the two possible outputs (190, 192) having an opposite polarity to the other. The output stage 102 is configured to receive a second data signal 114 to control the switching between the two possible outputs (190, 192), wherein the output stage 102 is coupled to the variable frequency conversion stage 106, wherein the switching between the two possible outputs (190, 192) changes the phase of a signal 198 from the variable frequency conversion stage by 180°.

Figure 1B:
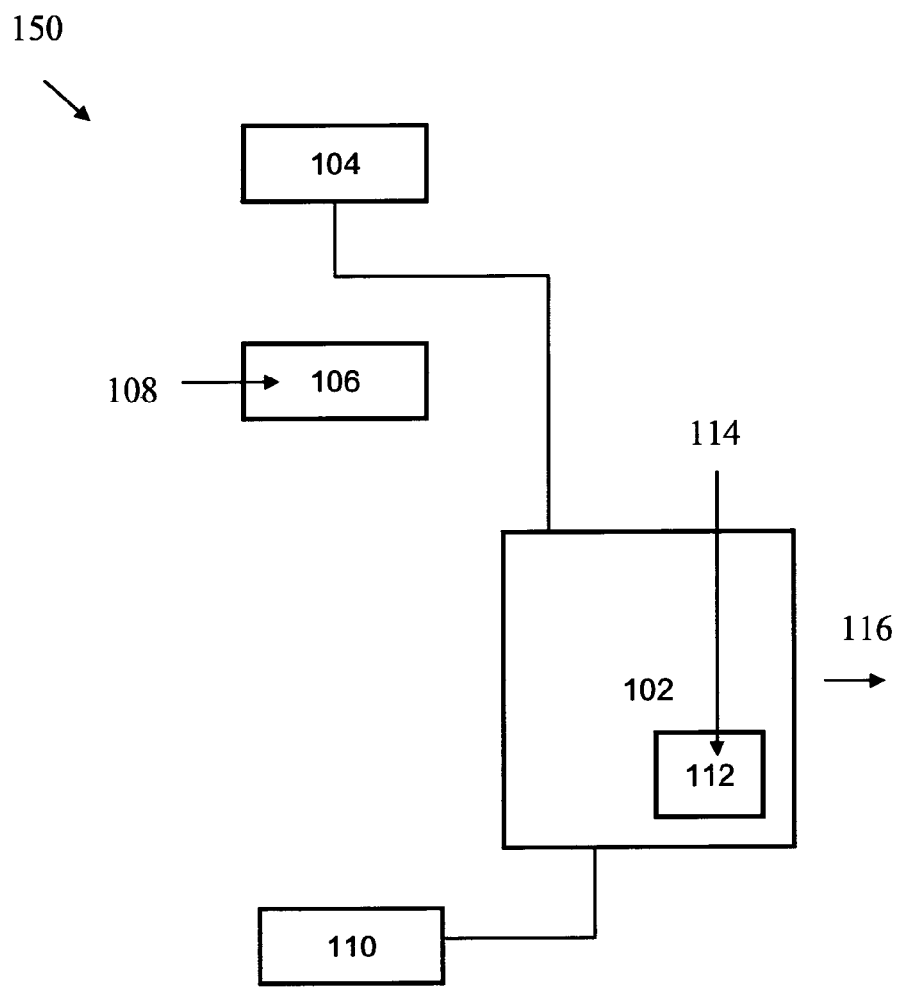
FIG. 1B is a schematic representation of a phase shift keying transmitter circuit according to an embodiment.

FIG. 1B is a schematic representation of a phase shift keying transmitter circuit 150 according to an embodiment.

In various embodiments, the phase shift keying transmitter circuit 150 may include: an output stage 102, an oscillation stage 104 coupled to the output stage 102, a variable frequency conversion stage 106 adapted to receive a first data signal 108, wherein an operating frequency of the variable frequency conversion stage 106 is determined by the first data signal 108 and an activation stage 110 to control operation of the oscillation stage 104, the activation stage 110 coupled to the output stage 102. The output stage 102 may include electrical coupling circuitry 112, the electrical coupling circuitry 112 adapted to receive a second data signal 114, the electrical coupling circuitry 112 reconfigurable in response to the second data signal 114 to cause the output stage 102 to operate in either a first position or a second position, wherein the polarity of signals 116 from the output stage 102 in the first position is opposite to the polarity of signals 116 from the output stage 102 in the second position.

Further detail on the output stage 102 producing one of two possible outputs (190, 192; see FIG. 1A) or operating in the first position and the second position (see FIG. 1B) is described with reference to FIGS. 2A and 2B.

Figure 2A:
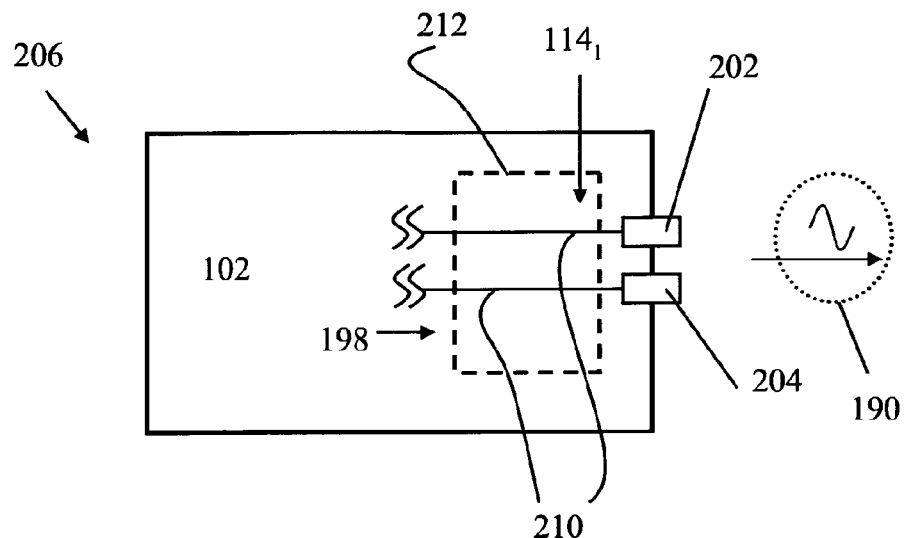
FIGS. 2A and 2B show schematic representations of the output stage of a phase shift keying transmitter, according to an embodiment.
Figure 2B:
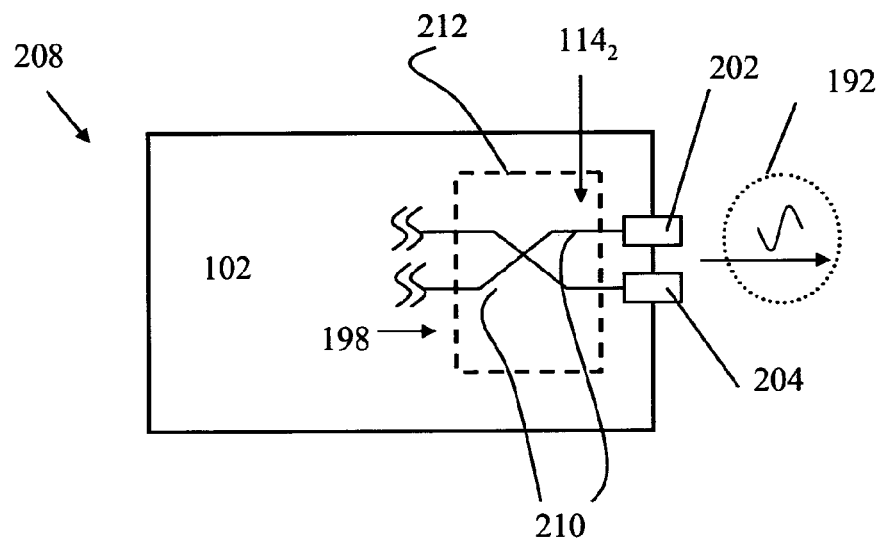

FIGS. 2A and 2B show schematic representations of the output stage 102 of the phase shift keying transmitter circuit of FIGS. 1A (100) and 1B (150). FIG. 2A shows the output stage 102 operating 206 to produce a first possible output 190 (see FIG. 1A) of the two possible outputs (190, 192; see FIG. 1A). FIG. 2B shows the output stage 102 operating 208 (see FIG. 1A) to produce a second possible output of the two possible outputs (190, 192; see FIG. 1A). In the embodiment shown in FIGS. 2A and 2B, the output stage 102 has two output ports 202 and 204. Although not shown, other embodiments have output stages having more than a pair of output ports: It will be appreciated that in FIGS. 2A and 2B, only a portion 212 of the output stage 102 that causes switching between the two possible outputs (190, 192) and toggles the polarity of signals in the output stage 102 is shown.

In FIG. 2A, the second data signal $114_1$ has configured the output stage 102 to operate 206 to produce a first output 190. In FIG. 2B, the second data signal $114_2$ has configured the output stage 102 to operate 208 to produce a second output 192. When comparing the first output 190 against the second output 192, there is a change in phase of 180° in the output signal. The numerals "$114_1$" and "$114_2$" are used to illustrate that in FIGS. 2A and 2B, the second data signal has a different value.

Comparing FIGS. 2A and 2B, application of the second data signal ($114_1$ and $114_2$) reverses the connections 210 to the output ports 202 and 204, so that the polarity of signals at the output stage 102 in FIG. 2A is opposite to the polarity of signals at the output stage 102 in FIG. 2B. Considering signal 198 (which is the signal from the variable frequency conversion stage 106, see FIG. 1A): in FIG. 2A, the signal 198 is sent to the output port 204, while in FIG. 2B, the signal 198 is sent to the other output port 202. In this manner, the output stage 102 is configurable between two operating polarities, where one operating polarity is the reverse of the other operating polarity.

In various embodiments, reversing the connection 212 at the output ports (202, 204) creates, from the perspective of external circuitry (not shown) connected to the output ports (202, 204), a phase difference of 180° in the output signal. In various embodiments, the switching that occurs at the output stage 102 may be used together with the variable frequency conversion stage 106 (see FIG. 1A) to control the output phase of the phase shift keying transmitter circuit 100.

Figure 3:
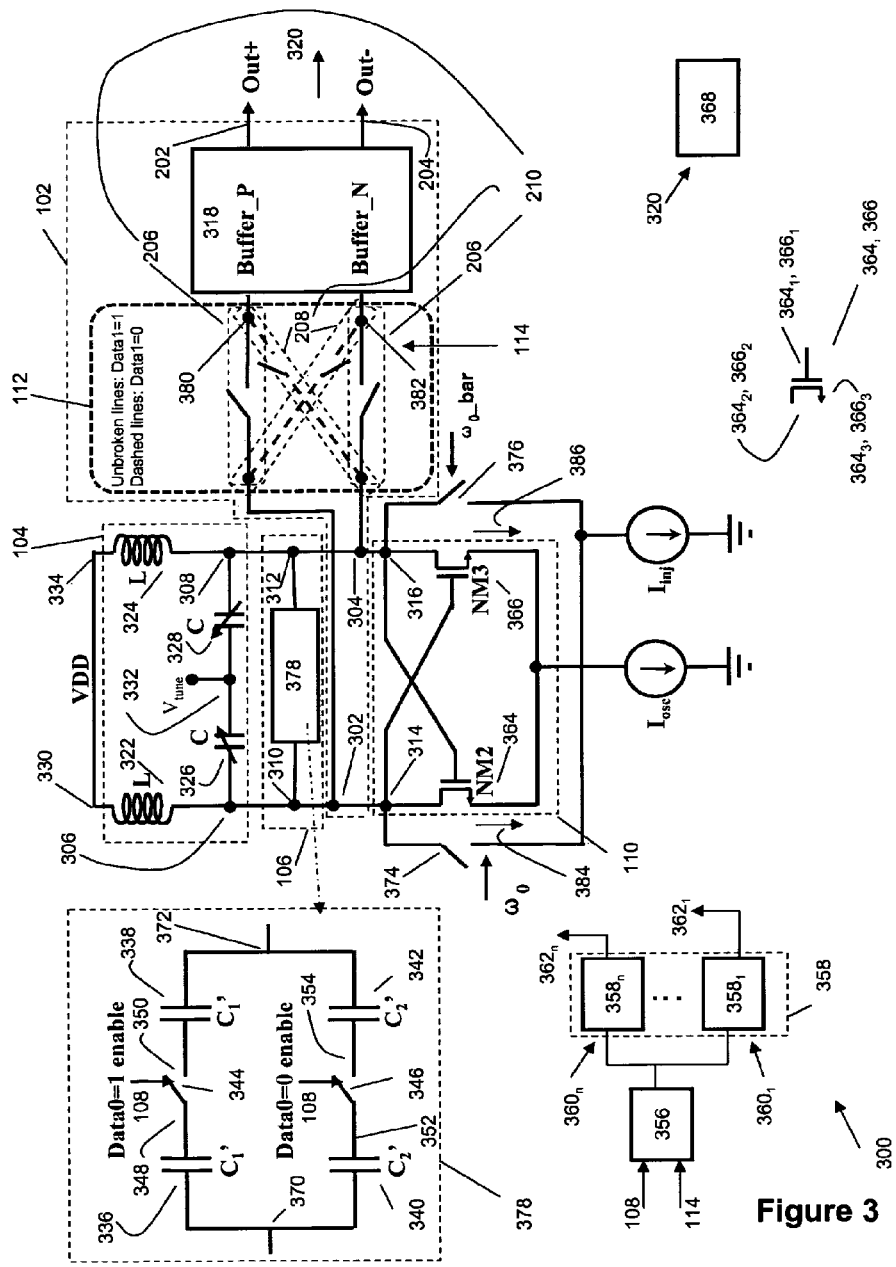
FIG. 3 shows the circuitry of a phase shift keying transmitter circuit, according to an embodiment.

FIG. 3 shows the circuitry of a phase shift keying transmitter circuit 300 according to an embodiment.

The phase shift keying transmitter circuit 300 is similar to the phase shift keying transmitter circuit of FIGS. 1A (100) and 1B (150) in that the phase shift keying transmitter circuit 300 has a variable frequency conversion stage 106 and an output stage 102. The variable frequency conversion stage 106 is adapted to receive a first data signal 108, wherein the variable frequency conversion stage 106 may include a plurality of frequency modulating elements (336, 338, 340 and 342). The first data signal 108 controls the number of the plurality of frequency modulating elements (336, 338, 340 and 342) that are operated so as to control an operating frequency of the variable frequency conversion stage 106. The output stage 102 is configured to, switch between one of two possible outputs, the signals provided by one of the two possible outputs having an opposite polarity to the other. The output stage 102 is configured to receive a second data signal 114 to control the switching between the two possible outputs, wherein the output stage 102 is coupled to the variable frequency conversion stage 106, wherein the switching between the two possible outputs changes the phase of a signal 198 from the variable frequency conversion stage by 180°.

Comparing the phase shift keying transmitter circuit 300 of FIG. 3 with the phase shift keying transmitter circuit 150 of FIG. 1B, the phase shift keying transmitter circuit 300 also has an oscillation stage 104 coupled to the output stage 102, and an activation stage 110 coupled to the output stage 102.

The various components of the output stage 102 are as follows.

The output stage 102 has a first terminal 302 to which a first terminal 310 of the variable frequency conversion stage 106 is coupled. The output stage 102 also has a second terminal 304 to which a second terminal 312 of the variable frequency conversion stage 106 is coupled. The first terminals (310, 302) of both the variable frequency conversion stage 106 and the output stage 102 and the second terminals (312 and 304) of both the variable frequency conversion stage 106 and the output stage 102 are located along separate signal paths (384 and 386) of the phase shift keying transmitter circuit 300.

The first terminal 302 of the output stage 102 is coupled to a respective terminal of each of the oscillation stage 104 and the activation stage 110. Specifically, first terminal 306 of the oscillation stage 104 is coupled to the first terminal 302 of the output stage 102 and first terminal 314 of the activation stage 110.

The second terminal 304 of the output stage 102 is coupled to a respective terminal of each of the oscillation stage 104 and the activation stage 110. Specifically, second terminal 308 of the oscillation stage 104 is coupled to the second terminal 304 of the output stage 102 and second terminal 316 of the activation stage 110.

The output stage 102 further includes a first output port 202; and a second output port 204. The output ports (202 and 204) have an electrical connection with the first and second terminals (302 and 304) of the output stage 102. In one of the two possible outputs provided by the output stage 102, the first terminal 302 of the output stage 102 is coupled to the first output port 202 and the second terminal 304 of the output stage 102 is coupled to the second output port 204. In the other of the two possible outputs provided by the output stage 102, the first terminal 302 of the output stage 102 is coupled to the second output port 204 and the second terminal 304 of the output stage 102 is coupled to the first output port 202.

In FIG. 3, the reference numeral 210 is used to denote the two possible electrical connections between the output ports (202 and 204) and the terminals (302 and 304), both of the output stage 102. In a first connection (denoted by the reference numeral 206), which is effected when the second data signal 114 configures the output stage 102 to produce one of two possible outputs (for example, a high control bit, "1"), the first terminal 302 is connected to the first output port 202 and the second terminal 304 is connected to the second output port 204. In a second connection (denoted by the reference numeral 208), which is effected when the second data signal 114 configures the output stage 102 to produce the other of two possible outputs (for example, a low control bit, "0"), the first terminal 302 is connected to the second output port 204 and the second terminal 304 is connected to the first output port 202. A transmission gate circuit (not shown) may be used to realise the two possible electrical connections. When the transmission gate circuit is implemented by, for example, NMOS transistors, the second data signal 114 controls which of the transistors will be activated to achieve the required connection.

The output stage 102 includes electrical coupling circuitry 112, the electrical coupling circuitry 112 controllable by the second data signal 114. The electrical coupling circuitry 112 controls switching of the electrical connection 210 between the output ports (202 and 204) of the output stage 102 and the terminals (302 and 304) of the output stage 102. The electrical coupling circuitry 112 is reconfigurable in response to the second data signal 114 to cause the output stage 102 to operate in either the first connection (depicted by the circled portions 206) or the second connection (depicted by the circled portions 208), wherein the polarity of the signal 320 from the output stage 102 in the first connection 206 is opposite to the polarity of the signal 320 from the output stage 102 in the second connection 208.

By toggling the electrical connection 210 within the electrical coupling circuitry 112, a simple mechanism to effect changing the phase of an output signal 320 of the output stage 102 is provided, so as to facilitate the creation of a distinct signal that represents the digital data encoded within the output signal 320.

In the embodiment shown in FIG. 3, the electrical coupling circuitry 112 is a swap circuit.

The output stage 102 further includes a buffer 318 connected between the electrical coupling circuitry 112 and both the first output port 202 and the second output port 204.

The oscillation stage 104 of the phase shift keying transmitter circuit 300 is coupled to the output stage 102.

In the context of various embodiments, the term "oscillation stage" may mean a stage that by itself, or together with one or more of the variable frequency conversion stage and the output stage, changes the phase of the output signal of the phase shift keying transmitter circuit. The various components of the oscillation stage 104 are as follows.

The oscillation stage 104 includes a plurality of inductors (322, 324), each coupled to the first terminal 302 or the second terminal 304 of the output stage 102; and a plurality of capacitors (326, 328), each coupled to the first terminal 302 or the second terminal 304 of the output stage 102. In the embodiment shown in FIG. 3, there are only two inductors (322, 324) and two capacitors (326, 328), wherein the capacitors (326, 328) are of the variable type. An analogue signal $V_{tune}$ may be used to fine frequency tune the operating frequency of the variable frequency conversion stage 106, through the two tunable capacitors (326, 328). Such a fine frequency tuning complements the discrete operating frequency changes of the variable frequency conversion stage 106 brought about by the number of capacitors $C_1'$ and $C_2'$ that are activated and the minimum capacitance of the activated capacitors $C_1'$ and $C_2'$. In other embodiments (not shown), there may be any number of inductors and capacitors, where either or both of the inductors and capacitors may have a fixed or variable rating. Specifically, several inductors connected in series or in parallel may be used in place of each of the plurality of inductors (322, 324) or several capacitors connected in series or in parallel may be used in place of each of the plurality of capacitors (326, 328).

A first terminal 306 of a first inductor 322 of the plurality of inductors (322, 324) is coupled to the first terminal 302 of the output stage 102 and a second terminal 330 of the first inductor 322 is coupled to a reference potential VDD. A first terminal 306 of a first capacitor 326 of the plurality of capacitors (326, 328) is coupled to the first terminal 302 of the output stage 102. A first terminal 308 of a second capacitor 328 of the plurality of capacitors (326, 328) is coupled to the second terminal 304 of the output stage 102 and a second terminal 332 of the second capacitor 328 is coupled to a second terminal 332 of the first capacitor 326. A first terminal 308 of a second inductor 324 of the plurality of inductors (322, 324) is coupled to the second terminal 304 of the output stage 102 and a second terminal 334 of the second inductor 324 is coupled to the reference potential VDD.

There may be one or more components (not shown) between the terminals within each of the various stages (102, 104, 106 and 110). Examples of these components include inductors and capacitors. For instance, there may be (not shown) an inductor or an additional capacitor located between the first terminal 306 of the oscillation stage 104 and the second terminal 308 of the oscillation stage 104. Similarly, there may be (not shown) an inductor or an additional capacitor located between the first terminal 310 of the variable frequency conversion stage 106 and the second terminal 312 of the variable frequency conversion stage 106.

In the embodiment shown in FIG. 3, the variable frequency conversion stage 106 is coupled to the output stage 102. The various components of the variable frequency conversion stage 106 are as follows.

The variable frequency conversion stage 106 includes a plurality of frequency modulating elements (336, 338, 340 and 342), each of the frequency modulating elements (336, 338, 340 and 342) coupled to the first terminal 302 or the second terminal 304 of the output stage 102. The variable frequency conversion stage 106 further includes a plurality of switches (344, 346), each coupled to a frequency modulating element from the plurality of the frequency modulating elements (336, 338, 340 and 342). Operation of the plurality of switches (344 and 346) is controlled by the first data signal 108 to operate the frequency modulating element (336, 338, 340 and 342). An NMOS transistor (not shown) may be used for each of the plurality of switches (344, 346), the operation of the NMOS transistor being controlled by the first data signal 108. In a first operation mode, none of the frequency modulating elements (336, 338, 340 and 342) is activated. In a second operation mode, either the frequency modulating elements (336 and 338) or the frequency modulating elements (340 and 342) is activated. In a third operation mode, all the frequency modulating elements (336, 338, 340 and 342) are activated.

A first terminal 370 of a first frequency modulating element 336 of the plurality of the frequency modulating elements (336, 338, 340 and 342) is coupled to the first terminal 302 of the output stage 102. A first terminal 348 of a switch 344 of the plurality of the switches (344 and 346) is coupled to a second terminal 348 of the first frequency modulating element 336. A first terminal 372 of a second frequency modulating element 338 of the plurality of the frequency modulating elements (336, 338, 340 and 342) is coupled to the second terminal 304 of the output stage 102, and a second terminal 350 of the switch 344 is coupled to a second terminal 350 of the second frequency modulating element 338.

Similarly, a first terminal 370 of a third frequency modulating element 340 of the plurality of the frequency modulating elements (336, 338, 340 and 342) is coupled to the first terminal 302 of the output stage 102. A first terminal 352 of a switch 346 of the plurality of the switches (344 and 346) is coupled to a second terminal 352 of the third frequency modulating element 340. A first terminal 372 of a fourth frequency modulating element 342 of the plurality of the frequency modulating elements (336, 338, 340 and 342) is coupled to the second terminal 304 of the output stage 102, and a second terminal 354 of the switch 346 is coupled to a second terminal 354 of the fourth frequency modulating element 342.

The variable frequency conversion stage 106 further includes a logic circuit 356 adapted to receive the first data signal 108 and the second data signal 114; and a plurality of multiplexers 358. Each of the multiplexers ($358_1, \ldots, 358_n$) is coupled to the output of the logic circuit 356 and adapted to receive an element of a binary input ($360_1, \ldots, 360_n$), wherein operation of a switch (344, 346) of the plurality of the switches (344, 346) is controlled by the output ($362_1, \ldots, 362_n$) of a respective multiplexer ($358_1, \ldots, 358_n$) of the plurality of multiplexers 358. In this manner, an option is provided to control operation of the switches (344, 346) using both the first data signal 108 and the second data signal 114.

In various embodiments, the term "element" in the phrase "element of a binary input" may refer to any bit of a binary input. For instance, the element may be the most significant bit or least significant bit in a digital word input.

Figure 6:
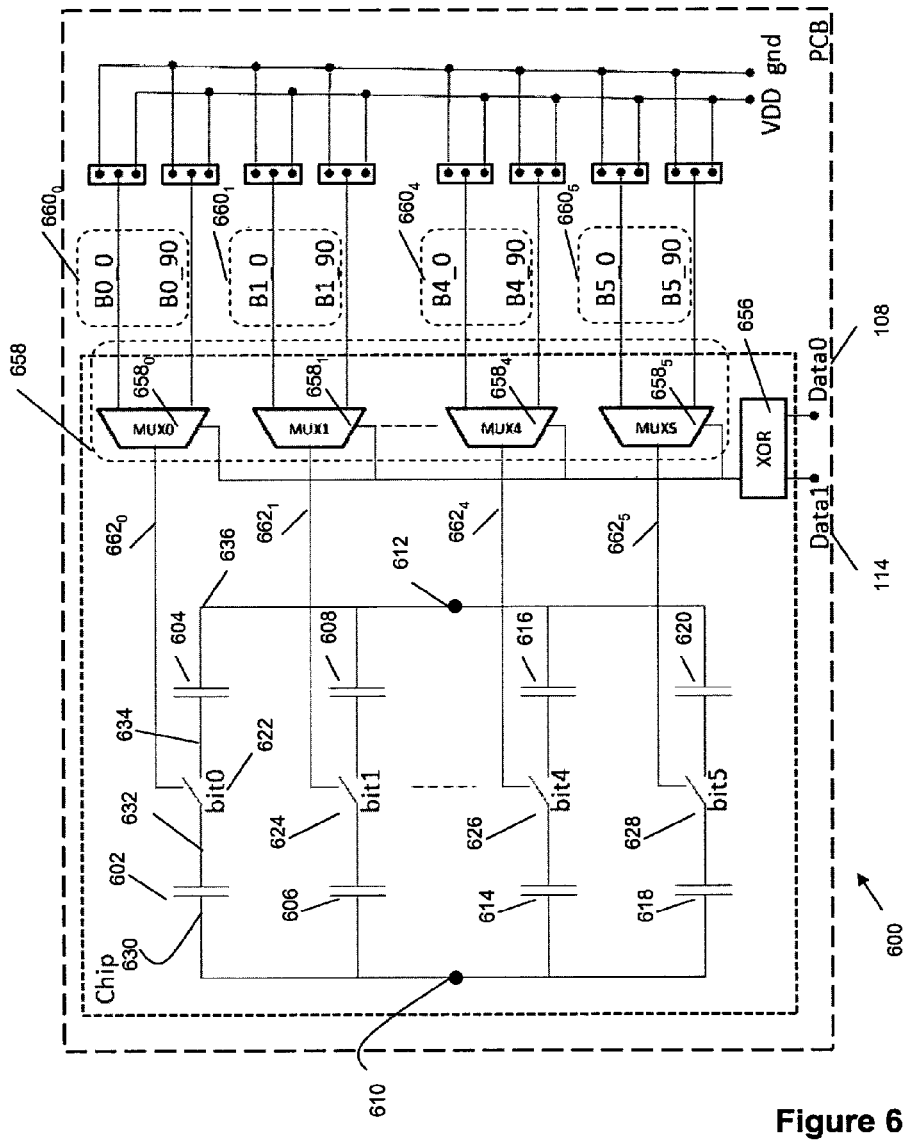
FIG. 6 shows a capacitor bank according to an embodiment.

In one embodiment, the logic circuit 356 performs an XOR operation. In one embodiment, the plurality of frequency modulating elements (336, 338, 340 and 342) and the plurality of switches (344 and 346) are arranged in an array. For example, in the embodiment shown in FIG. 3, the array has two rows of frequency modulating elements, where each row has two frequency modulating elements (336 and 338; 340 and 342) with a switch (344, 346) connecting the two respective frequency modulating elements (336 and 338; 340 and 342) together. In another embodiment, it is possible that the array has any number of rows of frequency modulating elements (for instance, FIG. 6 shows an array where there are six rows of capacitors). The number of the plurality of the frequency modulating elements (336, 338, 340 and 342) that are operated causes a 45° phase change of signals processed by the variable frequency conversion stage 106.

In the embodiment shown in FIG. 3, the plurality of frequency modulating elements (336, 338, 340 and 342) includes capacitors ($C_1', C_2'$). Although other values are possible, the capacitor ($C_1', C_2'$) has a value in the range of 1 pF to 5 pF, for example around 3 pF. Further, while the embodiment shown in FIG. 3 uses capacitors ($C_1', C_2'$) for the frequency modulating elements (336, 338, 340 and 342), other components, such as inductors, may be used. In the embodiment shown in FIG. 3, there are only two capacitors ($C_1', C_2'$) per row, but in other embodiments (not shown), any number of capacitors may be used.

The activation stage 110 of the phase shift keying transmitter circuit 300 is coupled to the output stage 102. In the context of various embodiments, the term "activation stage" may mean a stage that is used to switch the phase shift keying transmitter circuit on or off.

The various components of the activation stage 110 are as follows.

The activation stage 110 includes a plurality of transistors (364, 366), each coupled to the first terminal 302 or the second terminal 304 of the output stage 102, wherein the first terminal 302 of the output stage 102 and the second terminal 304 of the output stage 102 are connected to a reference current $I_{inj}$. In the embodiment shown in FIG. 3, the reference current $I_{inj}$ is an injected signal having a designated harmonic that is chosen to be the same as the targeted carrier frequency of the phase shift keying transmitter circuit 300. Also, in the embodiment shown in FIG. 3, the connection of the first terminal 302 of the output stage 102 to the reference current $I_{inj}$ is controlled via a switch 374. The connection of the second terminal 304 of the output stage 102 to the reference current $I_{inj}$ is controlled via a switch 376.

A control terminal $364_1$ of a first transistor 364 of the plurality of the transistors (364, 366) is coupled to the second terminal 304 of the output stage 102, a first controlled terminal $364_2$ of the first transistor 364 is coupled to the first terminal 302 of the output stage 102 and a second controlled terminal $364_3$ of the first transistor 364 is coupled to a biasing current $I_{osc}$. A control terminal $366_1$ of a second transistor 366 of the plurality of the transistors (364, 366) is coupled to the first terminal 302 of the output stage 102, a first controlled terminal $366_2$ of the second transistor 366 is coupled to the second terminal 304 of the output stage 102 and a second controlled terminal $366_3$ of the second transistor 366 is coupled to the biasing current $I_{osc}$. In the embodiment shown in FIG. 3, both the reference current $I_{inj}$ and the biasing current $I_{osc}$ are connected to ground. In another embodiment (not shown), both the reference current $I_{inj}$ and the biasing current $I_{osc}$ may each be connected to different reference potentials or a same non-zero reference potential.

The first data signal 108 and the second data signal 114 are elements of data to be transmitted. In the embodiment shown in FIG. 3, where the first data signal 108 and the second data signal 114 are each a discrete single bit of data, the phase of an output signal 320 of the output stage 102 becomes modulated by only two bits of data, so that the circuit 100 becomes a quadrature phase shift keying (QPSK) RF transmitter. At any instance, the output signal 320 will then have encoded therein, digital data belonging to any one of the following combinations: 00, 01, 10 or 11.

At the receiver end, a phase shift keying receiver 368 is adapted to receive and extract data from a signal transmitter, such as the phase shift keying transmitter circuit 300. With reference to receiving the output signal 320 from the phase shift keying transmitter circuit 300, the phase shift keying receiver 368 is configured to recover the original data transmitted, through the use of, for example, mapping circuitry.

For the sake of simplicity, several same reference numerals (such as 306, 308, 332, 350, 352, 354, 370 and 372) have been used above to denote terminals belonging to different components, especially since these same reference numerals indicate terminals that are respectively coupled together. For example:

the same reference numeral 306 is used to denote the first terminals of all of the first inductor 322, the first capacitor 326 and the oscillation stage 104;

the same reference numeral 308 is used to denote the first terminal of the second inductor 324, the first terminal of the second capacitor 328 and the second terminal of the oscillation stage 104;

the same reference numeral 332 is used to denote the second terminals (332 and 332) of both the first capacitor 326 and the second capacitor 328;

the same reference numeral 350 is used to denote the second terminal of the switch 344 and the second terminal of the second frequency modulating element 338;

the same reference numeral 352 is used to denote the first terminal of the switch 346 and the second terminal of the third frequency modulating element 340;

the same reference numeral 354 is used to denote the second terminal of the switch 346 and the second terminal of the fourth frequency modulating element 342;

the same reference numeral 370 is used to denote the first terminals of both the first frequency modulating element 336 and the third frequency modulating element 340; while the same reference numeral 372 is used to denote the first terminals of both the second frequency modulating element 338 and the fourth frequency modulating element 342.

However, it is not the case that only terminals denoted with the same reference numeral are those that are coupled together. For example:

terminal 306 is coupled together with terminals 310, 302, 314 and 370 and also with the reference current $I_{inj}$, where connection of any of these terminals 306, 310, 302, 314 and 370 to the reference current $I_{inj}$ is through the switch 374;

terminal 308 is coupled together with terminals 312, 304, 316 and 372 and also with the reference current $I_{inj}$, where connection of any of these terminals 308, 312, 304, 316 and 372 to the reference current $I_{inj}$ is through the switch 376; and terminals 330 and 334 are coupled together with the reference potential VDD.

The phase shift keying transmitter circuit 300 is a low-power low-complexity transmitter based on injection-lock technology. From FIG. 3, the phase shift keying transmitter circuit 300 includes an LC VCO (inductor-capacitor voltage controlled oscillator, implemented by the oscillation stage 104), a capacitor bank 378 (inside the variable frequency conversion stage 106), a pair of differential injection signals ($\omega_0$ and $\omega_0$_bar), a swap circuit (implemented by the electrical coupling circuitry 112) and a buffer 318. In various embodiments, the term "injection-lock" may mean that an oscillation stage (the LC tank) of the voltage controlled oscillator (VCO) of a phase shift keying transmitter circuit locks to the frequency $\omega_0$ of an injected signal. A created phase shift depends on the frequency difference between the LC VCO free-running frequency and the injected frequency.

In the embodiment shown in FIG. 3, the VCO is designed to generate a frequency which is around a targeted carrier frequency, $\omega_0$. The VCO is designed to cover a certain range sufficient enough to generate the required phase shift. The injected differential signals ($\omega_0$ and $\omega_0$_bar) have frequency $\omega_0/N$, where N is an even number.

Operation of the phase shift keying transmitter circuit 300 is as follows.

Figure 4:
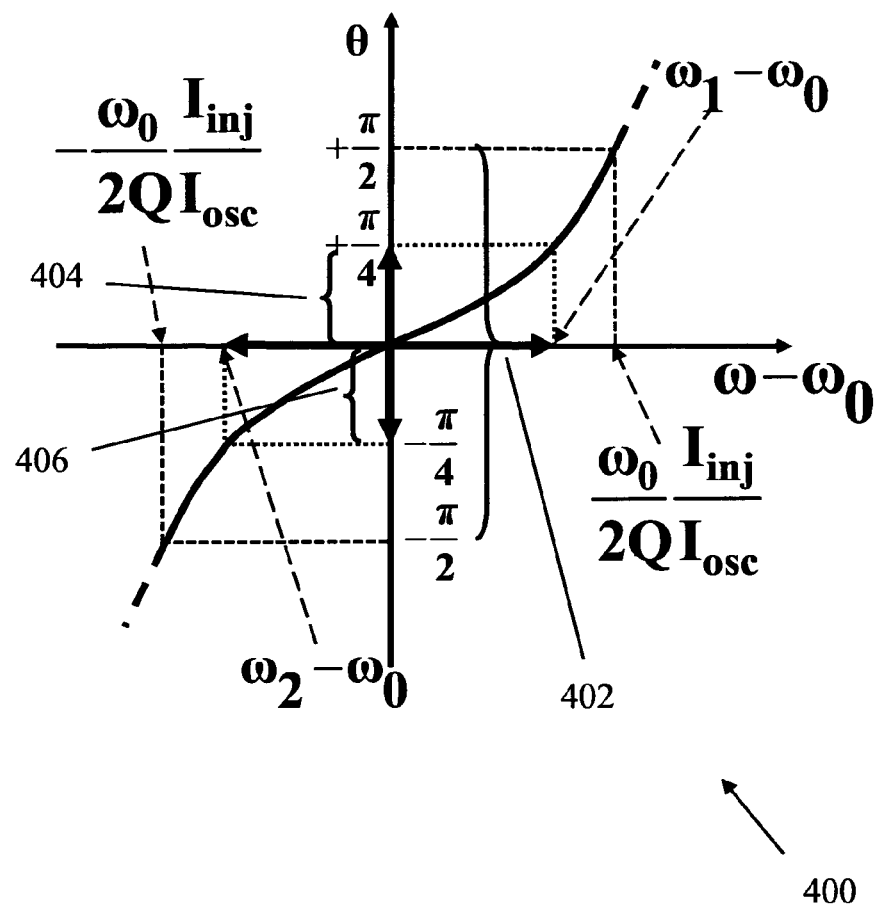
FIG. 4 shows a graph of θ, created phase difference, against $\omega-\omega_0$, the difference between free running frequency and targeted carrier frequency.

FIG. 4, which shows a graph 400 being a plot of θ, created phase difference, against $\omega-\omega_0$, the difference between LC VCO free running frequency and targeted carrier frequency. Associating the symbols shown in FIG. 4 with the phase shift keying transmitter circuit 300 of FIG. 3: ω is the LC VCO free running frequency, $\omega_0$ is the $N^{th}$ harmonic of the injected signal (shown as $\omega_0$ and $\omega_0$_bar in FIG. 3); Q is the quality factor of the LC VCO 104; $I_{inj}$ is the injected current located at $\omega_0$; $I_{osc}$ is the LC VCO 104 bias current; and θ is the created phase difference.

As illustrated in FIG. 4, with constant injected frequency $\omega_0$, if the free running frequency ω changes from $-(\omega_0/2Q)*(I_{inj}/I_{osc})$ to $(\omega_0/2Q)*(I_{inj}/I_{osc})$, the relative phase will change 180° (indicated by the reference numeral 402).

For a QPSK transmitter, 90° phase difference should be achieved. In one embodiment, injection lock technology can be used to provide a sufficient range to achieve the 90° phase difference between a 45° phase shift (indicated by reference numeral 404) and a −45° phase shift (indicated by reference numeral 406).

With reference to FIG. 3, data0 (the first data signal 108) controls the capacitor bank 378 and switches the free-running frequency between $\omega_1$ and $\omega_2$, where $$\omega_1 = \frac{1}{\sqrt{LC_1}} = \frac{1}{\sqrt{L(C_1' + C)}} \qquad (1)$$

and $$\omega_2 = \frac{1}{\sqrt{LC_2}} = \frac{1}{\sqrt{L(C_2' + C)}}. \qquad (2)$$

In the embodiment shown in FIG. 3, when the first data signal 108 has a digital value of "1", the switch 344 will be closed, while the switch 346 remains open, so that the capacitors 336 and 338 (each having capacitance of $C_1'$) are connected to the output stage 102 to provide the free-running frequency of $\omega_1$, while the capacitors 340 and 342 are disconnected from the output stage 102. On the other hand, when the first data signal 108 has a digital value of "0", the switch 346 will be closed, while the switch 344 remains open, so that the capacitors 340 and 342 (each having capacitance of $C_2'$) are connected to the output stage 102 to provide the free-running frequency of $\omega_2$, while the capacitors 336 and 338 are disconnected from the output stage 102. It is also possible that the operation of the switches (344 and 346) are reversed, so that when the first data signal 108 has a digital value of "1", the switch 344 will open and the switch 346 close; and when the first data signal 108 has a digital value of "0", the switch 344 will close and the switch 346 open. Thus, input of the first data signal 108 and maintenance at one of its discrete values, has the variable frequency conversion stage 106 kept at a free-running frequency (two free-running frequencies, $\omega_1$ and $\omega_2$, are described, although more free-running frequencies are possible when there are more rows of capacitors within the capacitor bank 378). Further, from equations (1) and (2), the capacitance values of the capacitors (326, 328, 336, 338, 340 and 342) and the inductance values of the inductors (322 and 324) have an impact on the free-running frequency $\omega_1$ and $\omega_2$.

Returning to FIG. 4, taking the phase of the injected signal ($I_{inj}$ shown in FIG. 3) as a reference, though the absolute phase difference will not be 45°, the relative phase shift will be 90° (indicated by the span of the reference numerals 404 and 406 along the θ axis) between the free-running frequency $\omega_1$ and $\omega_2$. Through injection lock technology, a phase shift of 45° and −45° are achieved on the injected signal $I_{inj}$.

After undergoing phase shift of 45° and −45°, the injected signal $I_{inj}$ is sent to the swap circuit (within the electrical coupling circuitry 112), which is controlled by data1 (the second data signal 114) as shown in FIG. 3.

In the embodiment shown in FIG. 3, when the second data signal 114 has a digital value of "1", the connection within the swap circuit is as per the connection shown as unbroken lines in the electrical coupling circuitry 112. In more detail, the first terminal 302 of the output stage 102 will be coupled to an output port 380 of the electrical coupling circuitry 112, while the second terminal 304 of the output stage 102 will be coupled to an output port 382 of the electrical coupling circuitry 112.

When the second data signal 114 has a digital value of "0", the connection within the swap circuit is as per connection shown as dashed lines in the electrical coupling circuitry 112. In more detail, the first terminal 302 of the output stage 102 will be coupled to the output port 382 of the electrical coupling circuitry 112, while the second terminal 304 of the output stage 102 will be coupled to the output port 380 of the electrical coupling circuitry 112.

It is also possible that the operation of the swap circuit is reversed. When the second data signal 114 has a digital value of "1", the first terminal 302 of the output stage 102 will be coupled to the output port 382 of the electrical coupling circuitry 112, while the second terminal 304 of the output stage 102 will be coupled to the output port 380 of the electrical coupling circuitry 112. When the second data signal 114 has a digital value of "0", the first terminal 302 of the output stage 102 will be coupled to an output port 380 of the electrical coupling circuitry 112, while the second terminal 304 of the output stage 102 will be coupled to an output port 382 of the electrical coupling circuitry 112.

Thus, the effect of the swap circuit of the electrical coupling circuitry 112 would be to reverse the phase of the carrier signal, so that for the injected signal $I_{inj}$ already with 45° and −45° phase shift (compared with the original phase of the injected signal $I_{inj}$), an overall phase shift of −135° and 135° (compared with the original phase of the injected signal $I_{inj}$) would be achieved. The table 500 in FIG. 5 summarises the output phase shift 502 of a carrier signal when subjected to a respective combination of input from the first data signal 108 and the second data signal 114.

In order to get an accurate 90° phase shift by using injection lock technology, various embodiments use a binary weighted capacitor bank for the variable frequency conversion stage 106 (see FIG. 3). FIG. 6 shows an embodiment 600 of such a capacitor bank.

The capacitor bank 600 includes a plurality of capacitors (602, 604, 606, 608, 614, 616, 618 and 620), each of the capacitors (602, 604, 606, 608, 614, 616, 618 and 620) coupled to the first terminal 302 (compare FIG. 3) of the output stage 102 through a first terminal 610 of the capacitor bank 600 or the second terminal 304 (compare FIG. 3) of the output stage 102 through a second terminal 612 of the capacitor bank 600. Each of a plurality of switches (622, 624, 626 and 628) is coupled to a respective capacitor from the plurality of capacitors (602, 604, 606, 608, 614, 616, 618 and 620).

All the rows of the capacitor bank 600 have an identical electrical arrangement. Taking the first row as an example, a first terminal 630 of a first capacitor 602 is coupled to the first terminal 610 of the capacitor bank 600. A first terminal 632 of the switch 622 is coupled to a second terminal 632 of the first capacitor 602. A first terminal 636 of a second capacitor 604 is coupled to the second terminal 612 of the capacitor bank 600, and a second terminal 634 of the switch 622 is coupled to a second terminal 634 of the second capacitor 604.

A logic circuit 656 is adapted to receive the first data signal 108 and the second data signal 114. Each ($658_0, \ldots, 658_5$) of a plurality of multiplexers 658 is coupled to the output of the logic circuit 656 and adapted to receive an element of a binary input ($660_0, \ldots, 660_5$). Operation of a switch (622, 624, 626 and 628) of the plurality of switches (622, 624, 626 and 628) is controlled by the output ($662_0, \ldots, 662_5$) of a respective multiplexer ($658_0, \ldots, 658_5$) of the plurality of multiplexers 658.

Since each of the multiplexers ($658_0, \ldots, 658_5$) receives, as one of its input, an output of the logic circuit 656, the operation of each switch (622, 624, 626 and 628) is controlled by the first data signal 108 and the second data signal 114. In addition, since each of the multiplexers ($658_0, \ldots, 658_5$) also receives, as another of its input, a respective one of the binary inputs ($660_0, \ldots, 660_5$), operation of each switch (622, 624, 626 and 628) is also dependent on the respective one of the binary input ($660_0, \ldots, 660_5$), in that the capacitor bank 600 value is binary-oriented. In the embodiment shown in FIG. 6, the logic circuit 656 performs an XOR operation. Although other values are possible, each of the capacitors (602, 604, 606, 608, 614 and 616) has a value in the range of 1 pF to 5 pF, for example around 3 pF.

The phase shift keying transmitter circuit 300 (see FIG. 3) provides a QPSK (Quadrature Phase Shift Keying) RF transmitter based on injection-lock technology. The QPSK transmitter, according to various embodiments, demonstrates features such as low-power, low-complexity and higher bandwidth efficiency comparing to other known modulation techniques. Various embodiments find application in wireless communication systems like GSM (Global System for Mobile Communications) and is also suitable for biomedical applications.

Figure 18:
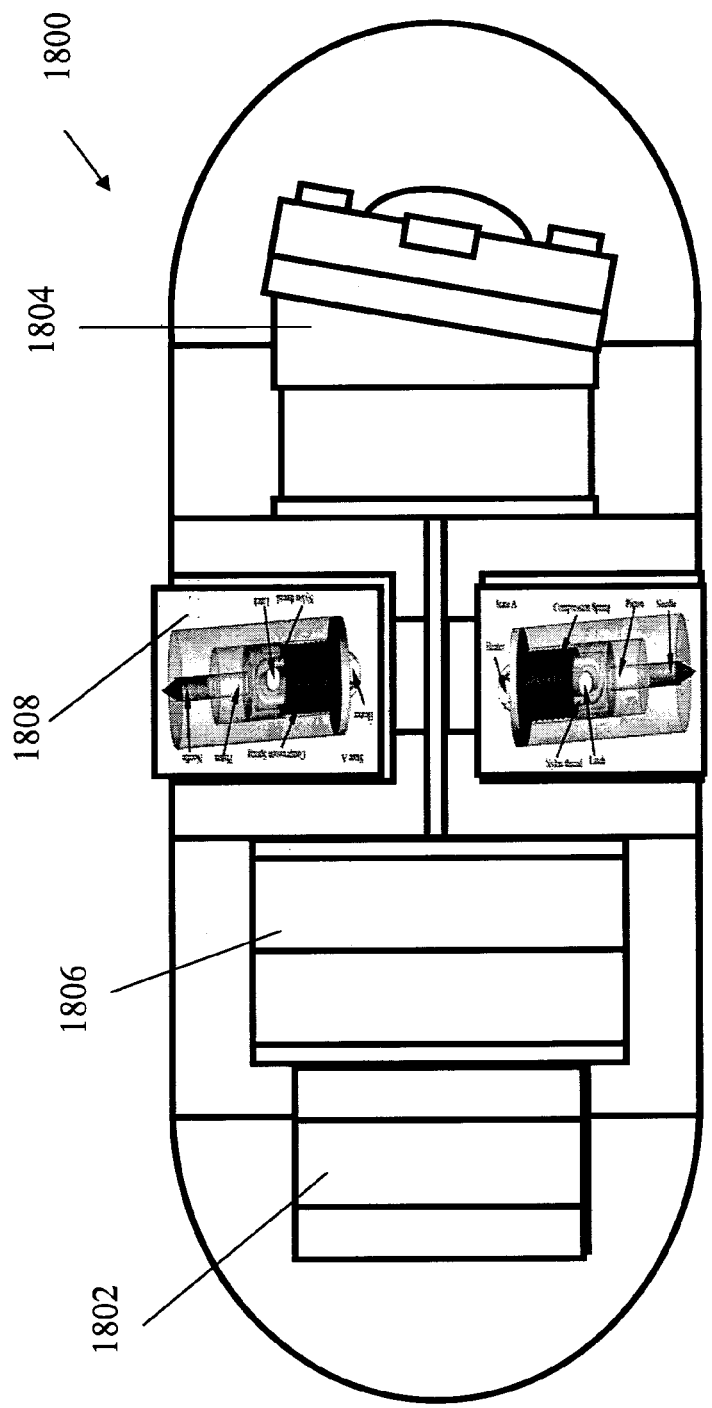
FIG. 18 shows a schematic representation of an in-body capsule that incorporates a phase shift keying transmitter circuit, according to an embodiment.

In designing various embodiments, a balance is sought between the power consumption and the locking range, the settling time and the power consumption, the locking range and the phase accuracy controlled by the smallest capacitor unit. Since the phase shift keying transmitter circuit 300 (see FIG. 3) is applied to an in-body pill (see. FIG. 18), various embodiments have power consumption as the first priority. As various embodiments use QPSK, phase accuracy is more easily satisfied compared to 8 PSK and 16 PSK.

For injection lock technology, phase noise is mainly determined by the reference signal phase noise. Various embodiments adopt a crystal, which demonstrates quite good phase noise. For instance, there are known crystal oscillator that can achieve −150 dBc/Hz phase noise. Various embodiments use such a crystal oscillator and when $11^{th}$ order harmonics injection is used, the phase noise is around −140 dBc/Hz, which is sufficient to satisfy design requirement. As there is no LO leakage problem, because the injected signal is quite far from the final output carrier, design parameters are relaxed for various embodiments.

Figure 7:
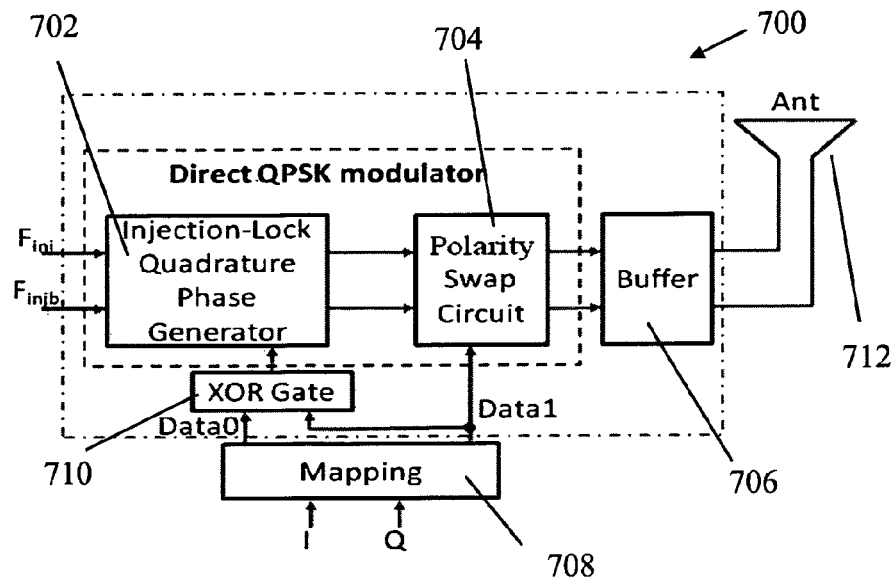
FIG. 7 is a schematic representation of a direct QPSK/O-QPSK modulation architecture, according to one embodiment.

FIG. 7 is a schematic representation of a direct QPSK/O-QPSK modulation architecture 700, according to one embodiment, employing a subharmonic injection-locked oscillator. The architecture 700 includes an injection-locked VCO (IL-VCO) 702, a polarity swap circuit 704, a buffer 706, a mapping circuitry 708 which transforms input I and Q signals to corresponding output phases, an XOR Gate 710 and an antenna 712. By eliminating the need of multi-phase PLL (phase lock look) and having the VCO 702 operate at twice the output frequency, the architecture 700 can work with very low power consumption.

Figure 8:
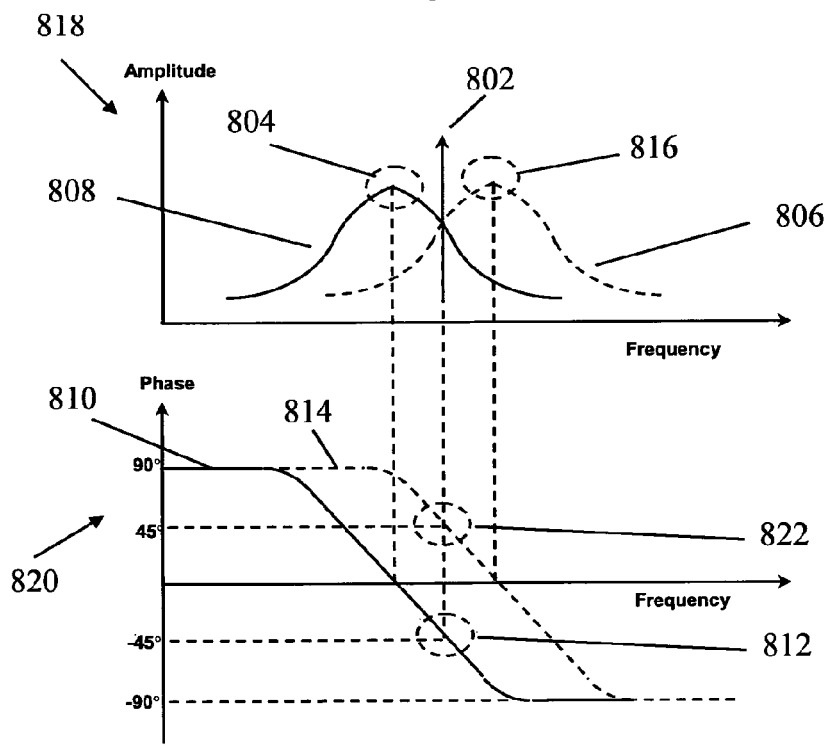
FIG. 8 shows graphs illustrating the effect of phase modulation through modifying the self resonant frequency of a LC (inductor-capacitor) tank, according to an embodiment.

The phase modulation principle of the architecture 700 is illustrated in FIG. 8. FIG. 8 shows graphs 818 and 820 illustrating the effect of phase modulation through modifying the self resonant frequency of a LC (inductor-capacitor) tank, according to an embodiment. Graph 818 is a plot of output amplitude against frequency. Graph 820 is a plot of output phase shift against frequency.

Although the output frequency of the IL-VCO 702 (see FIG. 7) is locked to the harmonic 802 of the injected signal, its output phase is determined by the difference between the self-resonant frequency of the LC tank (not shown) within the VCO 702 (see FIG. 7) and the harmonic 802 of the injected signal. A more detailed discussion on the output phase being determined by the difference between the self-resonant frequency of an LC tank and the harmonic of an injected signal can be found in B. Razavi; "A study of injection locking and pulling in oscillators," *IEEE J. Solid-State Circuits*, vol. 39, No. 9, pp. 1415-1424, September 2004.

As illustrated by the solid line curves (808 and 810) in FIG. 8, by controlling the self-resonant frequency (denoted by the reference numeral 804) of the LC tank to be lower than the harmonic frequency 802 of the injected signal in such a way that the LC tank signal 808 coinciding with the harmonic frequency 802 of the injected signal lags (denoted using the reference numeral 812) behind the harmonic 802 of the injected signal by 45°, an output signal comes to exhibit −45° phase shift. On the other hand, as illustrated by the dotted line curves (806 and 814) by making the self-resonant frequency (denoted by the reference numeral 816) higher than the harmonic signal 802 so that the LC tank signal 806 coinciding with the harmonic frequency 802 can be ahead (denoted using the reference numeral 822) of the harmonic signal by 45°, an output signal phase shift becomes +45°. Therefore, by changing the self-resonant frequency (804 and 816) of the LC tank, a phase difference of 90° can be created in an output signal. The self-resonant frequency of an LC tank can be easily modified through capacitor bank switching (as earlier described with reference to FIGS. 3 and 4).

With reference to FIG. 7, to generate all four phases required for QPSK/O-QPSK modulation, the polarity swap circuit 704 is employed to introduce 180° phase shift to the output signal. By employing both a capacitor bank (which is incorporated inside the VCO 702) and the polarity swap circuit 704, +45°, −45°, −135° and +135° phase shifts, required for QPSK/O-QPSK modulation, are realised.

In addition to having lower power consumption, various embodiments have improved phase noise performance, as the phase noise characteristics of the IL-VCO 702 follows the characteristics of the injected signal ($F_{inj}$, $F_{inj}$), rather than that of the on-chip VCO. A more detailed discussion on phase noise following the characteristics of an injected signal can be found in J. Lee and H. Wang, "Study of subharmonically injection-locked PLLs", *IEEE J. Solid-State Circuits*, vol. 44, No. 5, pp. 1539-1553, May 2009. Improved phase noise performance leads to better error vector magnitude (EVM) performance of the QPSK/O-QPSK transmitter. In various embodiments, the power consumption can be as low as 5.88 mW at 1.4V supply while transmitting at 50 Mbps. The simplicity of the architecture 700 also results in smaller die area.

Figure 9:
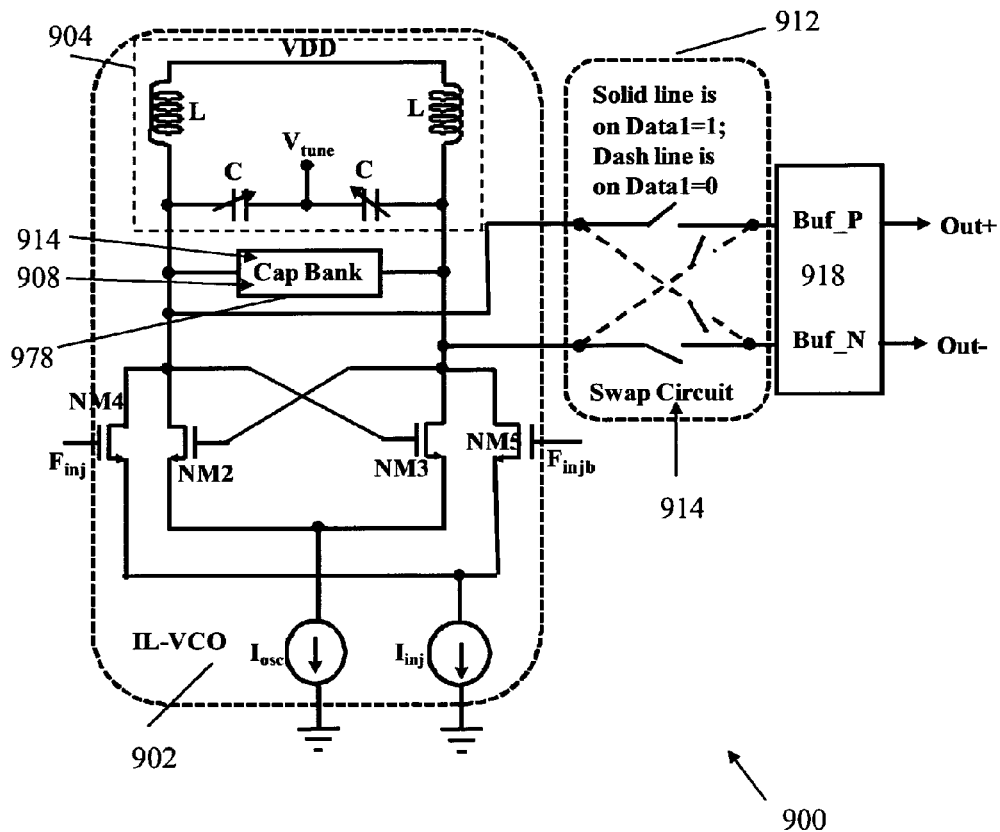
FIG. 9 shows the circuitry of a phase shift keying transmitter circuit, according to an embodiment.

FIG. 9 is a schematic representation of a phase shift keying transmitter circuit 900 according to an embodiment. Since the architecture of the phase shift keying transmitter circuit 900 of FIG. 9 is similar to the phase shift keying transmitter circuit 300 of FIG. 3 (which has been described in detail above), only selected features of the phase shift keying transmitter circuit 900 are described.

The phase shift keying transmitter circuit 900, employing an injection lock voltage controlled oscillator (IL-VCO) 902, includes a symmetrical NMOS cross-coupled pair (NM2, NM3), an LC tank incorporating a center-tapped differential inductor L and a capacitor bank 978, differential pair transistors (NM4, NM5) for signal injection and tail currents ($I_{osc}$ and $I_{inj}$). $F_{inj}$ and $F_{injb}$ are differential injected signals. Comparing the phase shift keying transmitter circuit 900 of FIG. 9 with the phase shift keying transmitter circuit 300 of FIG. 3, the phase shift keying transmitter circuit 900 uses differential pair transistors (NM4, NM5) as switches (compare switches 374 and 376 in FIG. 3) to introduce the differential injected signals, $F_{inj}$ and $F_{injb}$, into the phase shift keying transmitter circuit 900.

The free-running LC VCO 902 has self-resonant frequency $\omega_0$ centered around the target carrier frequency $\omega_c$. The designated harmonic of the injected signal $\omega_{inj}$ is chosen to be the same as $\omega_c$. With reference to the above description associated with FIG. 8, the self-resonant frequency $\omega_0$ can be changed by switching the capacitor bank 978 to generate the desired phase shift of +45°, −45°, −135° and +135°, as explained earlier.

Figure 10:
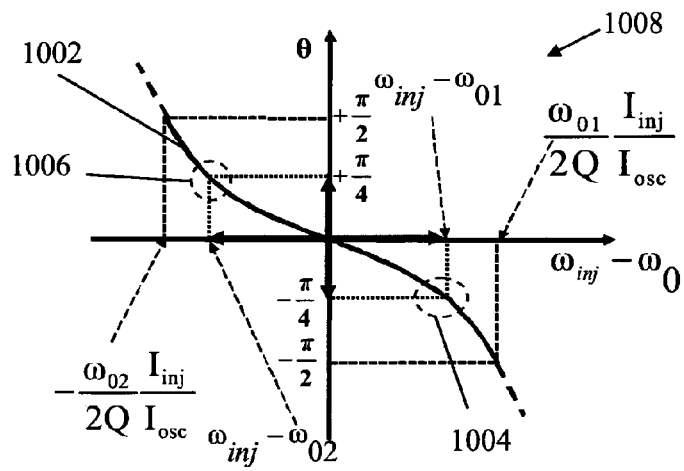
FIG. 10 is a graph showing phase relationship with respect to the frequency difference between the harmonic of an injected signal and the self-resonant frequency of a phase shift keying transmitter circuit, according to an embodiment.

FIG. 10 shows the phase relationship with respect to frequency difference between the harmonic of the injected signal and self-resonant frequency ($\omega_{inj}-\omega_0$), as reproduced from B. Razavi; "A study of injection locking and pulling in oscillators," *IEEE J. Solid-State Circuits*, vol. 39, No. 9, pp. 1415-1424, September 2004.

FIG. 10 is a graph 1008 of a plot of θ, created phase difference, against $\omega_{inj}-\omega_0$, the frequency difference between the harmonic of an injected signal and a self-resonant frequency of a LC VCO.

In the context of the phase shift keying transmitter circuit 900 of FIG. 9, where the injected signal $\omega_{inj}$ is fixed, the curve 1002 in FIG. 10 shows the variation of phase shift with respect to the self-resonant frequency $\omega_0$ of the LC VCO 902. As shown in FIG. 10, when the self-resonant frequency $\omega_0$ of an LC tank varies from $\omega_{01}$ to $\omega_{02}$, the output phase changes from −45° (see reference numeral 1004) to +45° (see reference numeral 1006). Therefore, the curve 1002 serves as a reference in designing the capacitor bank 978 to have a sufficiently wide range and high resolution to obtain self-resonant tank frequency of $\omega_{01}$ and $\omega_{02}$.

Returning to FIG. 9, in one embodiment, the IL-LCVCO 902 is locked to the 9th harmonic of a 100 MHz differential injection signal source $I_{inj}$. The lock range $\omega_L$ may be expressed as follows:

$$\omega_L = \frac{\omega_0}{2Q} \cdot \frac{I_{inj,9th}}{I_{osc}} = \frac{\omega_0}{2Q} \cdot \frac{4I_{inj,1st}}{I_{osc}9\pi}, \quad (3)$$

where Q is the tank quality factor, $I_{inj,9th}$ and $I_{inj,1st}$ are the amplitude of the 9th harmonic and the fundamental of the injected current $I_{inj}$ respectively. The ratio of $I_{inj,1st}$ to $I_{osc}$ is chosen such that the lock range $\omega_L$ is smaller than the fundamental injection frequency to avoid false locking, but large enough to achieve the desired phase resolution. A more detailed discussion on obtaining the lock range $\omega_L$ can be found in R. Harjani; N. LanKa; S. Patnaik, "Fast hopping injection locked frequency generation for UWB," *IEEE International Conf. on Ultra-Wideband*, pp. 502-507, September 2007.

Figure 11:
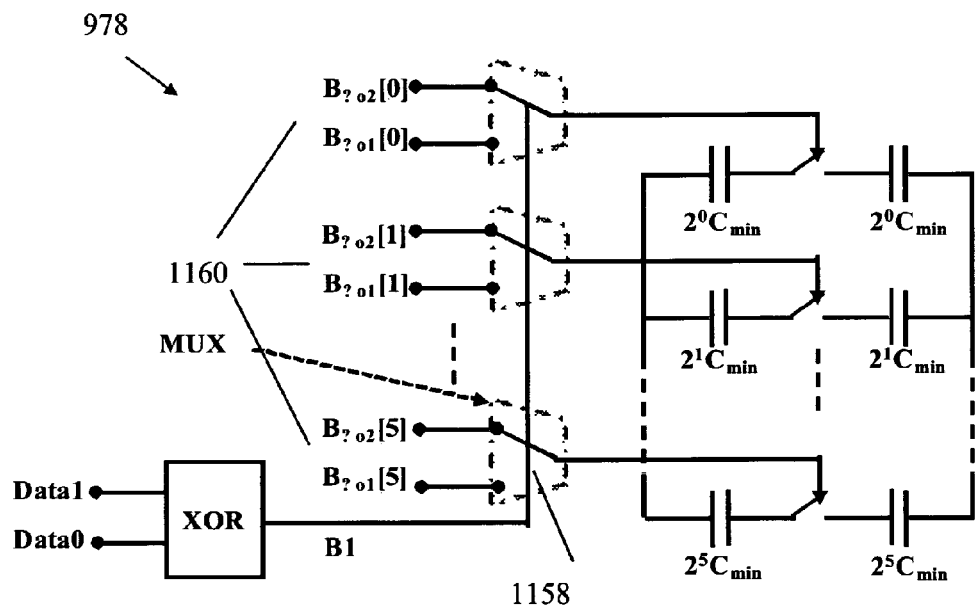
FIG. 11 shows a capacitor bank, according to an embodiment.

FIG. 11 shows an embodiment of the capacitor bank 978 of the phase shift keying transmitter circuit 900.

Since the architecture of the capacitor bank 978 of FIG. 11 is similar to the capacitor bank 678 of FIG. 6 (which has been described in detail above), only selected features of the capacitor bank 978 are described. Comparing the capacitor bank 978 of FIG. 11 with the capacitor bank 678 of FIG. 6, the capacitor bank 978 uses a switch 1158 for each of the plurality of multiplexers 658 in FIG. 6.

The capacitor bank 978 is a 6-bit binary capacitor bank implemented to provide sufficient resolution and coverage in self-resonant frequency tuning characteristics. Design of the capacitor bank 978, according to one embodiment, is as follows.

The resonant frequency of the capacitor bank 978 can be tuned to $\omega_{01}$ to $\omega_{02}$ (refer to reference numerals 1004 and 1006 in FIG. 10) by setting the control words. $B\omega_{01}[5:0]$ and $B\omega_{02}[5:0]$ (collectively indicated by the reference numeral 1160) respectively. The minimum phase step depends on both the minimum capacitor value $C_{min}$ and the lock range $\omega_L$ [see equation (3)]. Once the maximum allowable lock range without false locking is determined, the minimum capacitor value $C_{min}$ can be calculated to achieve the desired phase resolution. Although other values are possible, the minimum capacitor value $C_{min}$ has a value in the range of 10 fF to 100 fF, for example around 50 fF.

Considering FIG. 9 in conjunction with FIG. 11, the phase shift keying transmitter circuit 900 includes a polarity swap circuit 912 and a buffer 918. Two control signals Data0 (denoted using reference numeral 908) and Data1 (denoted using reference numeral 914) will modulate the phase shift keying transmitter circuit 900 to produce QPSK/O-QPSK signal.

Both Data0 (908) and Data1 (914) control the capacitor bank 978 values that get switched into the LC tank 904 through an XOR gate (refer to FIG. 11) to produce the desired resonant frequency $\omega_{01}$ or $\omega_{02}$, as described in the description above with reference to FIG. 11. Operation of the capacitor bank 978 at $\omega_{01}$ or $\omega_{02}$ respectively generates −45° and +45° phase modulation. The polarity swap circuit 912 then introduces a 180° phase shift to the output signal depending on the control signal Data1 (914). Operation of the polarity swap circuit 912 gives rise to two additional phases +135° and −135°. The capacitor bank 978, controlled through the XOR output, achieves Gray coding of the modulated phase. With reference to FIG. 7, both QPSK and O-QPSK modulation are implementable by the mapping circuitry 708 that performs the desired mapping between input I and Q data to the control signals Data0 (908) and Data1 (914).

In one embodiment, an inverter-type output buffer (not shown) may be adopted for the buffer 918. With further detail found in Y.-H. Liu, C.-L. Li and T.-H. Lin, "A 200-pJ/b MUX-based RF transmitter for implantable multichannel neural recording," *IEEE T. on Microwave Theory and Techniques*, vol. 57, pp. 2533-2541, October 2009, such an inverter-type output buffer is compatible with the quasi constant-envelope nature of O-QPSK modulation signals. The simulated power efficiency may then be around 20%.

Figures 12, 13A:
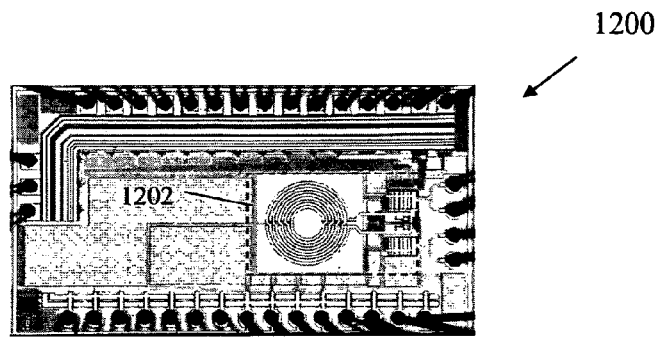
FIG. 12 shows a die photograph of a direct QPSK/O-QPSK transmitter chip, according to an embodiment.
FIG. 13A shows a table that summarises the performance of a transmitter chip, according to an embodiment, under 1.4V and 1.2V voltage supplies.

FIG. 12 shows a die photograph of a direct QPSK/O-QPSK transmitter chip 1200, according to an embodiment, fabricated using 0.18 μm CMOS process. The active core 1202 occupies an area of around 0.4 mm×0.7 mm. The chip 1200 was mounted on a printed circuit board (PCB) for testing. When transmitting at 50 Mbps data rate, the transmitter achieved EVM (error vector magnitude) of 6.6% and low power consumption (including buffer) of 5.88 mW and 3 mW at 1.4V and 1.2V supplies respectively. The table in FIG. 13A summarises the performance of the chip 1200 under 1.4V and 1.2V supplies.

The table in FIG. 13B summarises the comparison of the chip 1200 with other shift key transmitters disclosed in the following publications:

1304: A. C. W. Wong, G. Kathiresan, C. K. T. Chan, O. Eljamaly, O. Omeni, D. Mcdonagh, A. J. Burdett and C. Toumazou, "A 1V wireless transceiver for an ultra-low-power SoC for biotelemetry applications," *IEEE J. Solid-State Circuits*, vol. 43, No. 7, pp. 1511-1521, July 2008;

1306: Zarlink Corp.: Datasheet ZL70250;

1308: J. L. Bohorquez, A. P. Chandrakasan, and J. L. Daeson, "A 350 uW CMOS MSK transmitter and 400 uW OOK super-regenerative receiver, for medical implant communications," *IEEE J. Solid-State Circuits*, vol. 44, No. 4, pp. 1248-1259, April 2009; and

1310: Y.-H. Liu, C.-L. Li and T.-H. Lin, "A 200-pJ/b MUX-based RF transmitter for implantable multichannel neural recording," *IEEE T. on Microwave Theory and Techniques*, vol. 57, pp. 2533-2541, October 2009.

In addition, the chip 1200 provides a circuit that is less complex than the transmitters disclosed in the publications 1304 to 1310. In FIG. 13B, the term FOM is calculated using the equation:

$$FOM = \frac{DataRate(Mbps) \cdot Freq(GHz) \cdot Ptx(mW)}{Pconsum(mW)} \quad (4)$$

Figure 14A:
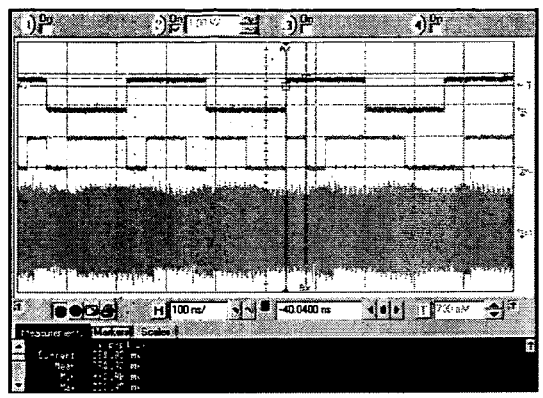
FIG. 14A shows graphs of time-domain measurement results of a phase shift keying transmitter circuit, according to an embodiment.
Figure 14B:
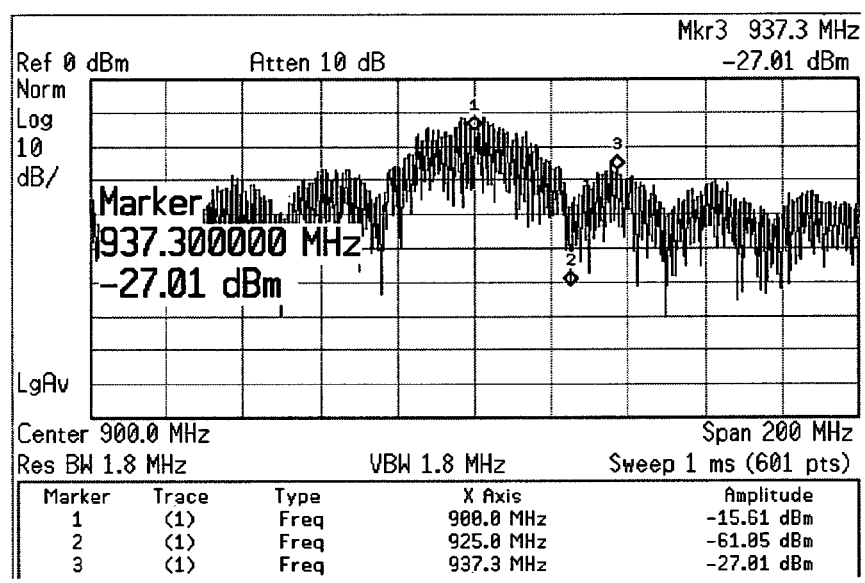
FIG. 14B shows the power spectrum of a QPSK signal, according to an embodiment, at a symbol rate of 25 Mbaud.
Figure 14C:
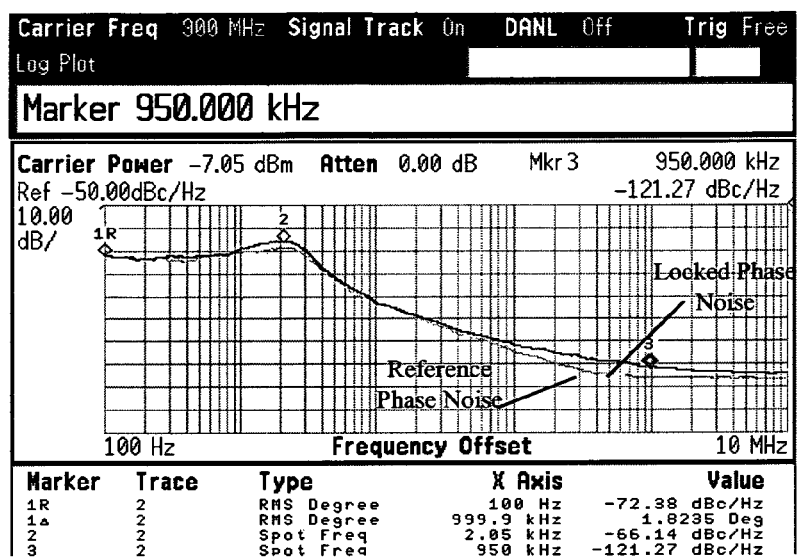
FIG. 14C shows measured phase noise.

FIGS. 14A to 14C show measurement results of the chip 1200 at 1.4V supply voltage.

FIG. 14A shows graphs of time-domain measurement results. The measured phase noise is −121 dBc/Hz at 1 MHz offset, as shown in FIG. 14C and limited by injection signal phase noise. For these measurements, a signal from a pattern generator with phase noise was employed as the injection signal. Nevertheless, the total integrated rms jitter was only 1.8°, which is sufficient for QPSK/O-QPSK transmission. FIG. 14B shows the power spectrum of the QPSK signal at symbol rate of 25 Mbaud.

The table below summarises simulation results of a phase shift keying transmitter circuit, according to an embodiment, using injection lock.

Simulated Results of QPSK Transmitter Using Injection Lock

| Parameter | Symbol | Conditions/Remarks | Typical | Range | units |
|---|---|---|---|---|---|
| Centre Frequency | f | | 900 | 900 | GHz |
| Supply Voltage | $V_{DD}$ | | 1.8 | 1.6~2.0 | V |
| Current Consumption | $I_{dd}$ | Measured at 1.8 V supply | 7 | 3.61~11 | mA |
| Settling Timing | Tset | | 6.7 | 5~11 | ns |
| Temperature | T | SS: 80 TT: 27 FF: −40 | 27 | Room temperature | ° C. |
| Output Power | Po | | 1.43 | −11~5.5 | dBm |
| Core Current | Icore | | 2.8 | 2~3.89 | mA |
| Input/Output Characteristic | | | | | |
| Data Voltage Level | D1; D0 | | 1.6 | 1~1.8 | V |
| Data Rate | $f_{In}$ | 50% duty cycle | 20 | 1~50 | MHz |
| Output voltage swing | $V_o$ | Differential output @ 400 Ω | 2.1 | 0.5~3.35 | V |
| Output Phase Variation | ψ | | ±2 | ±2~±3 | ° |
| Amplitude Variation | Avar | | 0.2 | 0.01~0.2 | V |
| Modulator Parameters | | | | | |
| Modulation | | QPSK | | | |

Figure 15:
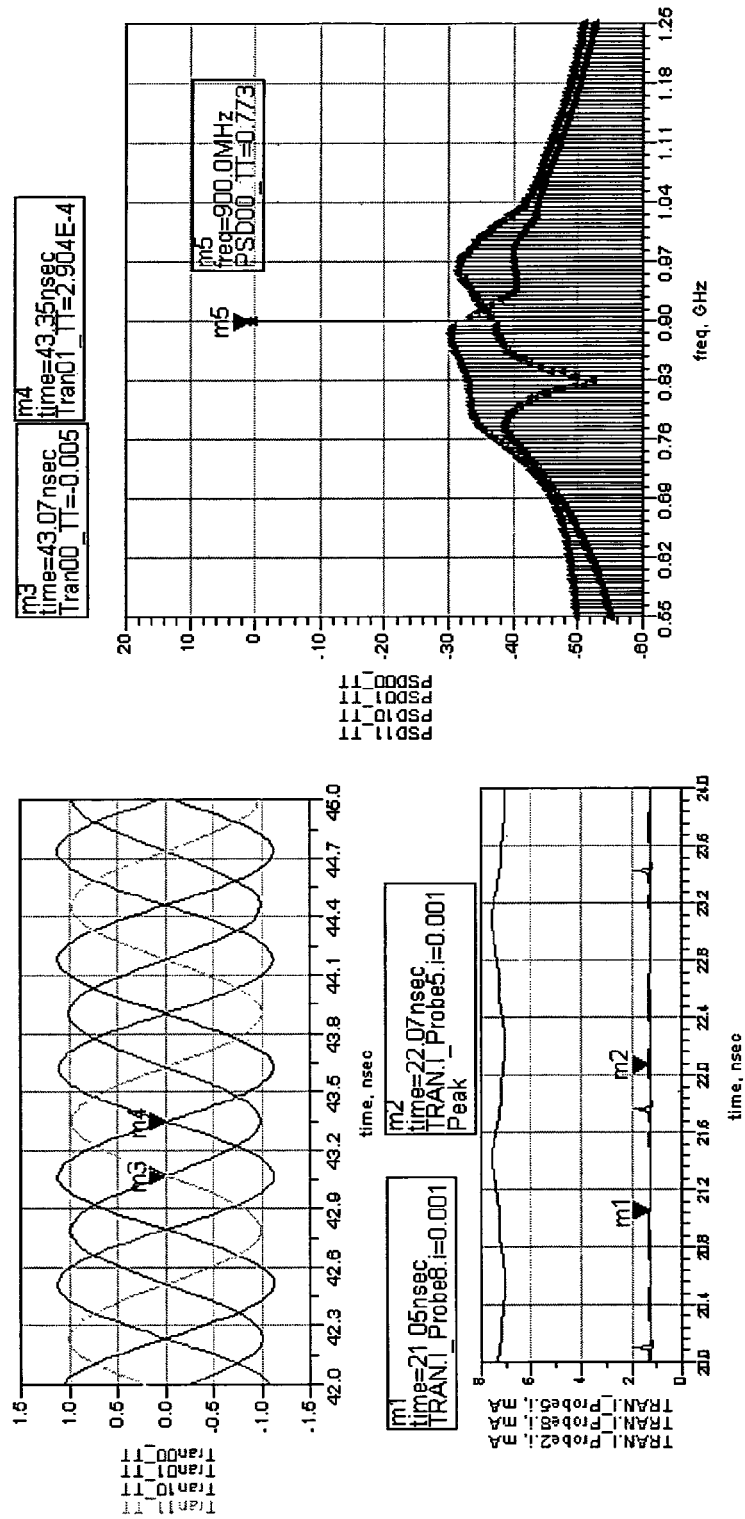
FIG. 15 shows overlapped 4-phase transient waveforms and a locked spectrum.
Figure 16:
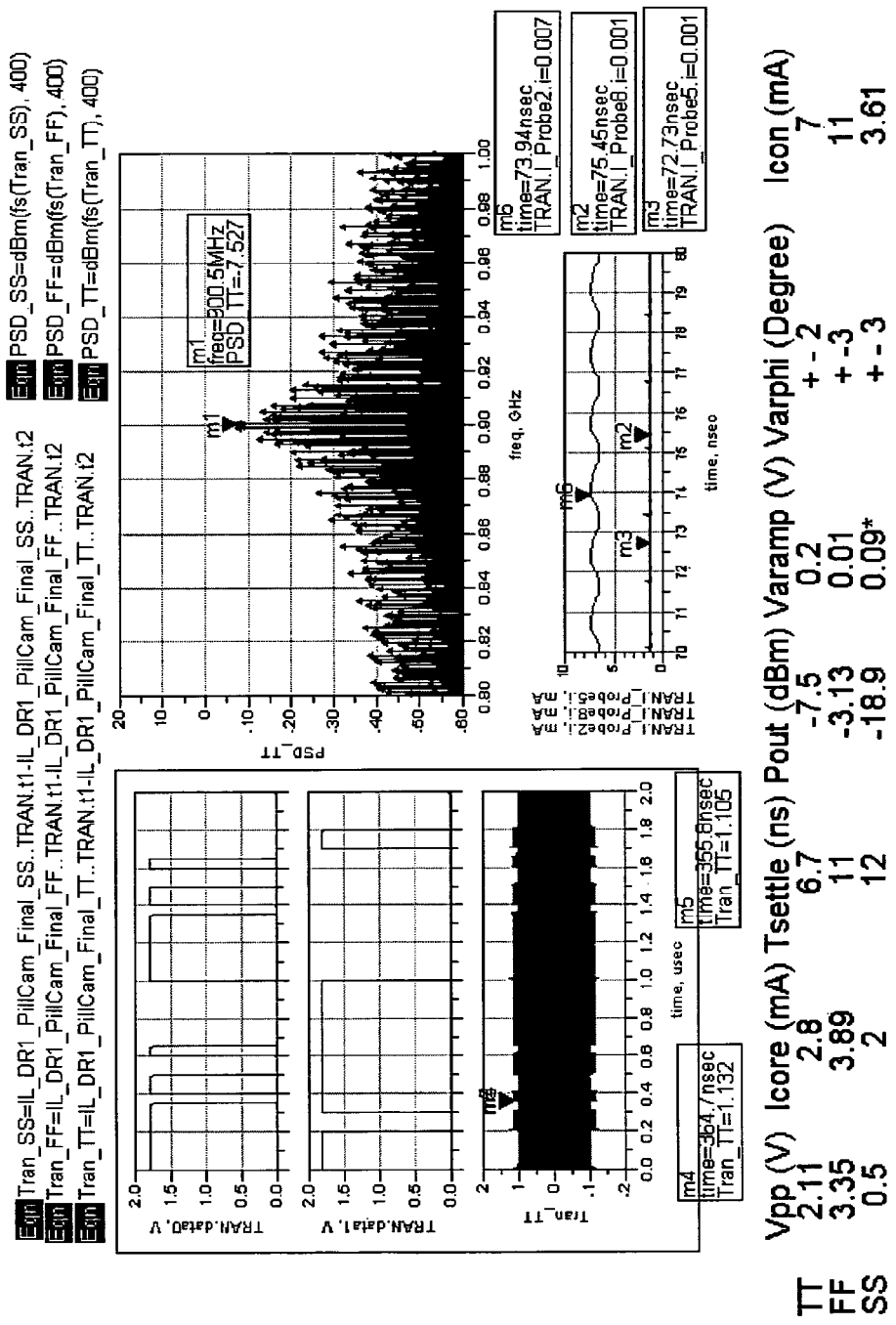
FIG. 16 shows a QPSK transient signal in a time-domain axis and its accompanying spectrum plot.

FIGS. 15 to 16 show simulation results of a phase shift keying transmitter circuit, according to one embodiment.

In FIGS. 15 and 16, m1 to m6 are position markers used to show performance of the phase shift keying transmitter circuit at various intervals during the simulation run.

FIG. 15 shows overlapped 4-phase transient waveforms (i.e. for an output signal with encoded data "00", "01", "10" and "11") and the locked spectrum. FIG. 15 shows that the output of a fabricated phase shift keying transmitter circuit is indistinguishable from the output of an ideal phase shift keying transmitter circuit, thereby establishing that there is little amplitude and phase error comparing the fabricated phase shift keying transmitter circuit against the ideal phase shift keying transmitter circuit.

FIG. 16 shows a QPSK transient signal in a time-domain axis and its accompanying spectrum plot. Simulation results under different operating conditions TT, FF and SS (to measure process variation) are also listed in this figure.

Figure 17:
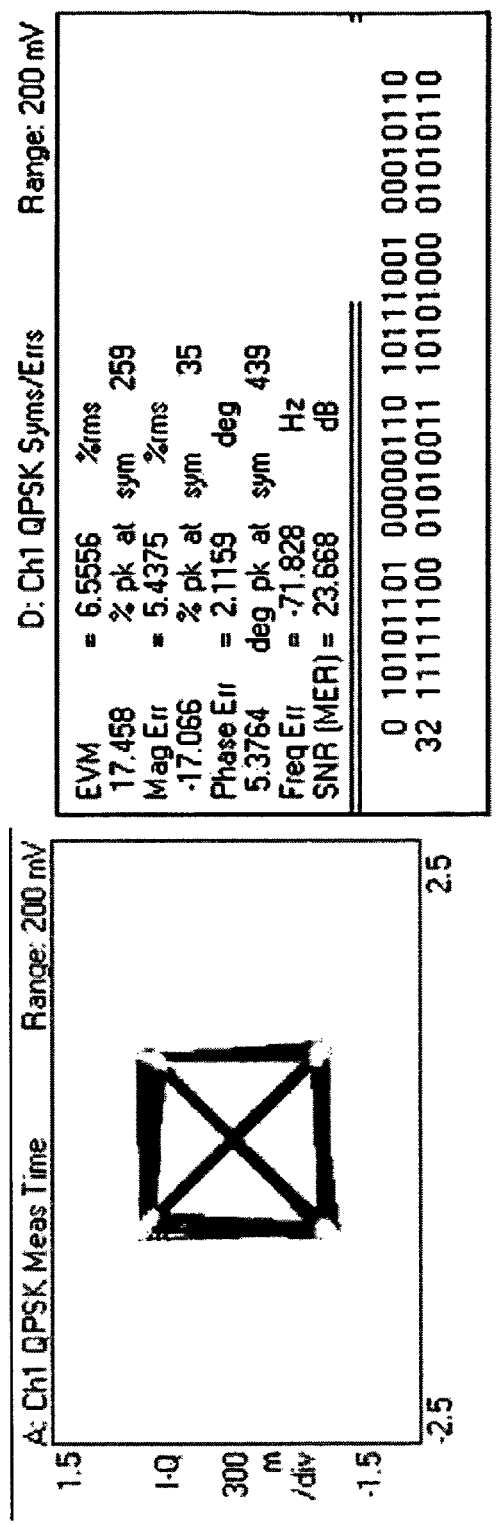
FIG. 17 shows a constellation diagram for the four phase output of a phase shift keying transmitter circuit, according to an embodiment.

FIG. 17 shows a constellation diagram that may be used to calculate EVM (error vector magnitude) of the four phase output of a phase shift keying transmitter circuit. FIG. 17 shows experimental results of a phase shift keying transmitter circuit, according to one embodiment, measured under 50 Mbps QPSK signal. The achieved EVM is 6.556%, which is equivalent to a signal-to-noise ratio of around −23 dB, therefore meeting the targeted BER of $10^{-4}$.

FIG. 18 shows a schematic representation of an in-body capsule 1800 that incorporates a phase shift keying transmitter, circuit 1802, according to an embodiment. The capsule 1800 may be introduced into a living organism to provide a means to monitor health signals from the living organism.

The capsule includes the phase shift keying transmitter circuit 1802; an image sensor 1804; a battery 1806 that powers the phase shift keying transmitter circuit 1802 and the image sensor 1804; and a microheater 1808. The microheater 1808 may be used to change the tilt angle of the image sensor 1804 to widen the optical angle range of capture.

Figure 19A:
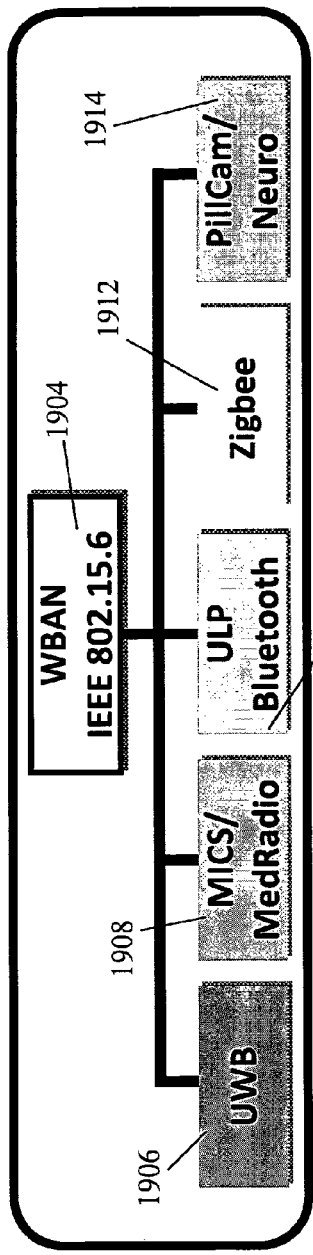
FIG. 19A shows a block representation of frequency bands that fall under a wireless body area network.

FIG. 19A shows a block representation of frequency bands that fall under a wireless body area network (WBAN) 1904, using IEEE 802.15.6 communication standards. The frequency bands include ultra wide band (UWB) 1906, a Medical Implant Communication Service (MICS) band 1908, ultra low power (ULP) Bluetooth band 1910 and Zigbee 1912. The frequency band 1914 within which a phase shift keying transmitter circuit, according to one embodiment, transmits falls under the WBAN 1904.

Figure 19B:
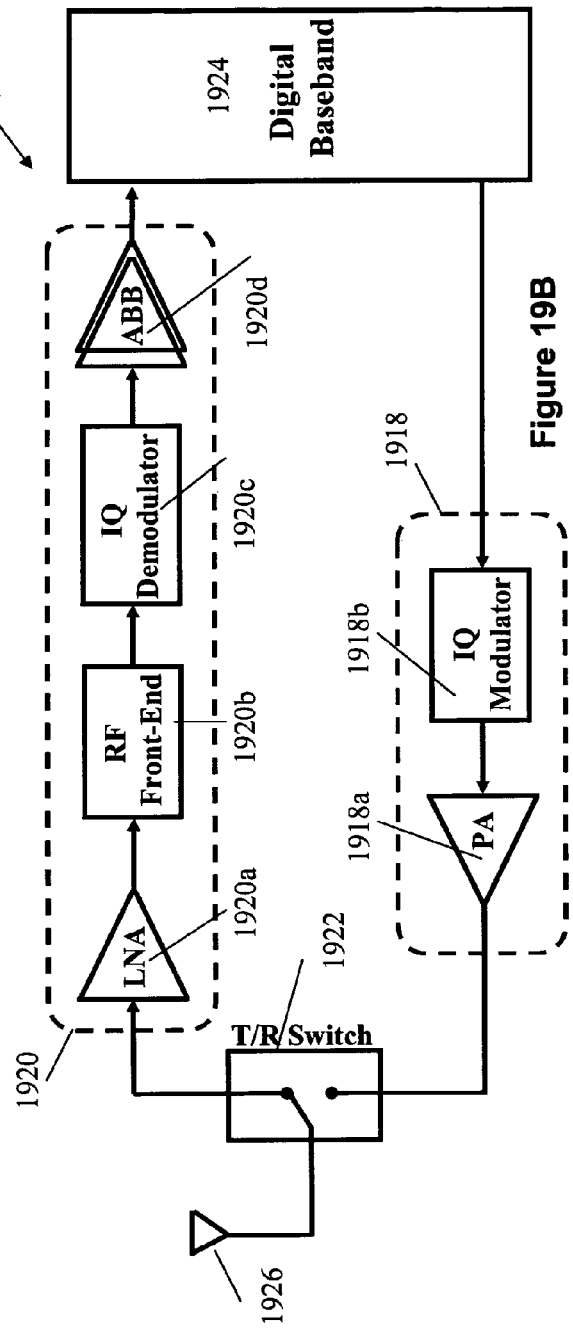
FIG. 19B shows a system having a transmitter block that incorporates a phase shift keying transmitter circuit, according to one embodiment.

FIG. 19B shows a system 1916 having a transmitter block 1918 that incorporates a phase shift keying transmitter circuit, according to one embodiment.

The system 1916 includes the transmitter block 1918; a switch 1922 that switches between allowing the system 1916 to receive or transmit signals to a coupled antenna 1926; a receiver block 1920 and a digital baseband block 1924.

The transmitter block 1918 further includes an amplifier 1918a and a modulator 1918b for I and Q signal paths.

The receiver block 1920 includes a low noise amplifier 1920a; a radio frequency front-end 1920b; a demodulator 1920c for I and Q signal paths and an amplifier 1920d.

While embodiments of the invention will be shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A phase shift keying transmitter circuit comprising:
a variable frequency conversion stage adapted to receive a first data signal, wherein the variable frequency conversion stage comprises a plurality of frequency modulating elements, wherein the first data signal controls the number of the plurality of frequency modulating elements that are operated so as to control an operating frequency of the variable frequency conversion stage; and
an output stage configured to switch between one of two possible outputs, the signals provided by one of the two possible outputs having an opposite polarity to the other, wherein the output stage is configured to receive a second data signal to control the switching between the two possible outputs, wherein the output stage is coupled to the variable frequency conversion stage and wherein the switching between the two possible outputs changes the phase of a signal from the variable frequency conversion stage by 180°;
wherein the output stage comprises:
a first terminal to which a first terminal of the variable frequency conversion stage is coupled;
a second terminal to which a second terminal of the variable frequency conversion stage is coupled, wherein the first terminals of both the variable frequency conversion stage and the output stage and the second terminals of both the variable frequency conversion stage and the output stage are located along separate signal paths of the phase shift keying transmitter circuit;
a first output port; and
a second output port, the output ports having an electrical connection with the first and second terminals of the output stage, wherein in one of the two possible outputs, the first terminal of the output stage is coupled to the first output port and the second terminal of the output stage is coupled to the second output port; and wherein in the other of the two possible outputs, the first terminal of the output stage is coupled to the second output port and the second terminal of the output stage is coupled to the first output port.

2. The phase shift keying transmitter circuit of claim 1, wherein the output stage comprises electrical coupling circuitry controllable by the second data signal, the electrical coupling circuitry controlling switching of the electrical connection between the output ports of the output stage and the terminals of the output stage.

3. The phase shift keying transmitter of claim 2, wherein the electrical coupling circuitry is a swap circuit.

4. The phase shift keying transmitter of claim 3, wherein the output stage further comprises a buffer connected between the electrical coupling circuitry and both the first output port and the second output port.

5. The phase shift keying transmitter circuit of claim 1, further comprising an oscillation stage coupled to the output stage.

6. The phase shift keying transmitter of claim 5, wherein the oscillation stage comprises
a plurality of inductors, each coupled to the first terminal or the second terminal of the output stage; and
a plurality of capacitors, each coupled to the first terminal or the second terminal of the output stage.

7. The phase shift keying transmitter of claim 6, wherein
a first terminal of a first inductor of the plurality of inductors is coupled to the first terminal of the output stage and a second terminal of the first inductor is coupled to a reference potential, a first terminal of a first capacitor of the plurality of capacitors is coupled to the first terminal of the output stage, a first terminal of a second capacitor of the plurality of capacitors is coupled to the second terminal of the output stage and a second terminal of the second capacitor is coupled to a second terminal of the first capacitor, and a first terminal of a second inductor of the plurality of inductors is coupled to the second terminal of the output stage and a second terminal of the second inductor is coupled to the reference potential.

8. The phase shift keying transmitter of claim 1, wherein each of the frequency modulating elements of the variable frequency conversion stage is coupled to the first terminal of the output stage or the second terminal of the output stage; and the variable frequency conversion stage further comprises:

a plurality of switches, each coupled to a frequency modulating element from the plurality of the frequency modulating elements, wherein operation of the plurality of switches is controlled by the first data signal to operate the frequency modulating elements.

9. The phase shift keying transmitter of claim 8, wherein a first terminal of a first frequency modulating element of the plurality of the frequency modulating elements is coupled to the first terminal of the output stage, a first terminal of a switch of the plurality of the switches is coupled to a second terminal of the first frequency modulating element, a first terminal of a second frequency modulating element of the plurality of the frequency modulating elements is coupled to the second terminal of the output stage, and a second terminal of the switch is coupled to a second terminal of the second frequency modulating element.

10. The phase shift keying transmitter of claim 8, wherein the variable frequency conversion stage further comprises a logic circuit adapted to receive the first data signal and the second data signal; and a plurality of multiplexers, each coupled to the output of the logic circuit and adapted to receive an element of a binary input, wherein operation of a switch of the plurality of the switches is controlled by the output of a respective multiplexer of the plurality of multiplexers.

11. The phase shift keying transmitter of claim 10, wherein the logic circuit performs an XOR operation.

12. The phase shift keying transmitter of claim 8, wherein the plurality of the frequency modulating elements and the plurality of the switches are arranged in an array.

13. The phase shift keying transmitter circuit of claim 1, wherein the number of the plurality of the frequency modulating elements that are operated causes a 45° phase change of signals processed by the variable frequency conversion stage.

14. The phase shift keying transmitter of claim 1, wherein the plurality of the frequency modulating elements comprises capacitors.

15. The phase shift keying transmitter circuit of claim 1, further comprising an activation stage coupled to the output stage.

16. The phase shift keying transmitter of claim 15, wherein the activation stage comprises a plurality of transistors, each coupled to the first terminal of the output stage or the second terminal of the output stage, wherein the first terminal of the output stage and the second terminal of the output stage are connected to a reference current.

17. The phase shift keying transmitter of claim 16, wherein a control terminal of a first transistor of the plurality of the transistors is coupled to the second terminal of the output stage, a first controlled terminal of the first transistor is coupled to the first terminal of the output stage and a second controlled terminal of the first transistor is coupled to a biasing current, a control terminal of a second transistor of the plurality of transistors is coupled to the first terminal of the output stage, a first controlled terminal of the second transistor is coupled to the second terminal of the output stage and a second controlled terminal of the second transistor is coupled to the biasing current.

18. A communication system comprising:

the transmitter of claim 1; and a receiver receiving the phase shift keying signal from the transmitter.

\* \* \* \* \*